United States Patent
Iwase et al.

(10) Patent No.: US 10,296,121 B2
(45) Date of Patent: May 21, 2019

(54) SHIFT REGISTER, DISPLAY DEVICE PROVIDED WITH SAME, AND SHIFT REGISTER DRIVING METHOD

(71) Applicant: SHARP KABUSHIKI KAISHA, Sakai, Osaka (JP)

(72) Inventors: Yasuaki Iwase, Sakai (JP); Takuya Watanabe, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/741,917

(22) PCT Filed: Jun. 29, 2016

(86) PCT No.: PCT/JP2016/069202
§ 371 (c)(1),
(2) Date: Jan. 4, 2018

(87) PCT Pub. No.: WO2017/006815
PCT Pub. Date: Jan. 12, 2017

(65) Prior Publication Data
US 2018/0196563 A1  Jul. 12, 2018

(30) Foreign Application Priority Data
Jul. 9, 2015 (JP) .................. 2015-137656

(51) Int. Cl.
| G09G 3/36 | (2006.01) |
| G06F 3/041 | (2006.01) |
| G11C 19/28 | (2006.01) |
| G02F 1/1333 | (2006.01) |
| G02F 1/1343 | (2006.01) |

(Continued)

(52) U.S. Cl.
CPC ........ *G06F 3/0412* (2013.01); *G02F 1/13338* (2013.01); *G02F 1/134309* (2013.01); *G02F 1/136286* (2013.01); *G09G 3/3677* (2013.01); *G11C 7/02* (2013.01); *G11C 19/28* (2013.01); *H01L 27/124* (2013.01);
(Continued)

(58) Field of Classification Search
None
See application file for complete search history.

(56) References Cited

U.S. PATENT DOCUMENTS 9,495,922 B2* 11/2016 Hirabayashi ......... G09G 3/3677
2006/0210012 A1* 9/2006 Yamaguchi ............ G11C 19/00
377/64

(Continued)

FOREIGN PATENT DOCUMENTS

| JP | 2013-190719 A | 9/2013 |
| JP | 2014-182203 A | 9/2014 |

*Primary Examiner* — Nicholas J Lee
(74) *Attorney, Agent, or Firm* — ScienBiziP, P.C.

(57) ABSTRACT

An object of the present invention is to realize a shift register that can interrupt a scan without causing a display failure or an abnormal action. A plurality of unit circuits each constitutes corresponding one of a plurality of stages in a shift register (310), the unit circuits each including a first unit circuit (UCa) connected to a gate bus line (GL) and configured to output a shift pulse to the connected gate bus line (GL) and to a succeeding stage, and a second unit circuit (UCb) connected to none of the gate bus lines (GL) and configured to output a shift pulse to a succeeding stage.

18 Claims, 20 Drawing Sheets

(51) Int. Cl.
  *G02F 1/1362* (2006.01)
  *H01L 27/12* (2006.01)
  *G11C 7/02* (2006.01)

(52) U.S. Cl.
  CPC .. *G02F 2201/121* (2013.01); *G02F 2201/123* (2013.01); *G09G 2310/0286* (2013.01)

(56) References Cited

U.S. PATENT DOCUMENTS

| | | | |
|---|---|---|---|
| 2011/0199365 A1* | 8/2011 | Umezaki | G09G 3/3677 345/212 |
| 2013/0241814 A1 | 9/2013 | Hirabayashi et al. | |
| 2014/0267156 A1 | 9/2014 | Koga et al. | |
| 2015/0317018 A1 | 11/2015 | Lin et al. | |
| 2017/0177131 A1 | 6/2017 | Koga et al. | |

* cited by examiner

SHIFT REGISTER, DISPLAY DEVICE PROVIDED WITH SAME, AND SHIFT REGISTER DRIVING METHOD

TECHNICAL FIELD

The present invention relates to a shift register, and more specifically to a shift register provided in a display device or the like provided with a touch panel.

BACKGROUND ART

In the related art, an active-matrix liquid crystal display device is known that is provided with a display unit including a plurality of source bus lines (video signal lines) and a plurality of gate bus lines (scanning signal lines). In such a liquid crystal display device, a gate driver (scanning signal line drive circuit) configured to drive the gate bus lines is often mounted at a periphery of a substrate constituting a liquid crystal panel, as an Integrated Circuit (IC) chip. However, in recent years, the number of such liquid crystal display devices is increasing that have adopted a configuration where the gate driver is formed directly on a TFT substrate. The TFT substrate is one of two glass substrates constituting the liquid crystal panel. Such a gate driver is referred to as a "monolithic gate driver" or the like.

A display unit of an active-matrix liquid crystal display device is provided with a plurality of source bus lines, a plurality of gate bus lines, and a plurality of pixel forming units provided in association with respective intersections between the plurality of source bus lines and the plurality of gate bus lines. The plurality of pixel forming units are arranged in a matrix to form a pixel array. Each of the pixel forming units includes a thin film transistor that includes a switching element with a gate terminal connected to a gate bus line routed through the corresponding intersection and a source terminal connected to a source bus line routed through the intersection, and a pixel capacity configured to hold a pixel voltage value, and the like. The active-matrix liquid crystal display device is also provided with the above-described gate driver and a source driver (video signal line drive circuit) configured to drive the source bus lines.

A video signal indicative of a pixel voltage value is transmitted through the source bus lines. However, each source bus line is unable to transmit video signals indicative of pixel voltage values for a plurality of rows at a time (at the same time). Thus, the video signals are sequentially written (charged) into the pixel capacities in the above-described pixel forming units arranged in a matrix, on a row-by-row basis. Thus, the gate driver is constituted of a shift register with a plurality of stages to allow the plurality of gate bus lines to be sequentially selected at predetermined time intervals. Then, active scan signals are sequentially output from each stage of the shift register to allow the video signals to be sequentially written into the pixel capacities on a row-by-row basis as described above.

A circuit constituting each of the stages of the shift register is referred herein to as a "unit circuit". A sequential selection of each gate bus line starting with the first gate bus line and ending with the final gate bus line is simply referred to as a "scan", and a stoppage of the scan after the first line and before the final line is referred to as a "scan interruption".

In recent years, there has been a growing popularity of a liquid crystal display device integrated with a touch panel and a liquid crystal panel together. In such a liquid crystal display device, a processing on the touch panel (for example, a processing for detecting a touched position) needs to be executed while a scan is not performed. However, in the shift register of the related art provided in the liquid crystal display device, all of the stages are configured in a similar manner. Thus, after the first gate bus line is selected, the scan cannot be stopped until the final gate bus line is selected.

Thus, PTL 1 discloses an invention for a shift register, enabling a scan interruption, in which an unit circuit (in PTL 1, described as a "transfer circuit") corresponding to a position where the scan is to be interrupted is configured to hold the potential of an input shift signal (shift pulse) for a long period.

CITATION LIST

Patent Literature

PTL 1: JP 2014-182203 A

SUMMARY OF INVENTION

Technical Problem

However, according to the disclosure of the shift register in PTL 1, gate bus lines connect to unit circuits (first transfer circuits) each configured to be able to hold the potential of the shift signal for a long period (see FIG. 20) as well as unit circuits (second transfer circuits) each configured not to be able to hold the potential of the shift signal for a long period (see FIG. 19). Specifically, both an output signal from the first transfer circuit and an output signal from the second transfer circuit are provided to the corresponding gate bus lines as scanning signals. In such a configuration, since the first transfer circuit holds the shift signal for a long period, a gate of a transistor Tr1 is biased for a longer period of time in the first transfer circuit than in the second transfer circuit. Thus, a threshold shift for the transistor Tr1 in the first transfer circuit is larger than a threshold shift for the transistor Tr1 in the second transfer circuit. Consequently, a waveform of the scanning signal in the gate bus line connected to the first transfer circuit is different from a waveform of the scanning signal in the gate bus line connected to the second transfer circuit. This may result in a display failure.

The interior state of each of the unit circuits (the first transfer circuits and the second transfer circuits) is reset only by the output signal from the succeeding unit circuit. Thus, during the processing on the touch panel being performed, an interior node in the unit circuit may be in an electrically floating state, and such a state may cause an abnormal action.

Thus, an object of the present invention is to realize a shift register that can interrupt a scan without causing a display failure or an abnormal action.

Solution to Problem

A first aspect of the present invention is a shift register configured to drive a plurality of scanning signal lines by performing a shift action based on a plurality of clock signals, the shift register including the plurality of stages, wherein a plurality of unit circuits each constitutes corresponding one of the plurality of stages, the unit circuits each including:

first unit circuits each connected to one of the plurality of scanning signal lines and configured to output a shift pulse to the connected scanning signal line and to a succeeding stage; and second unit circuits each connected to none of the plurality of scanning signal lines and configured to output a shift pulse to a succeeding stage.

According to a second aspect of the present invention, based on the first aspect of the present invention, the first unit circuit includes:

a first output node connected to a corresponding scanning signal line, a preceding stage, and a succeeding stage;

a first output control transistor including a control terminal, a first conducting terminal, and a second conducting terminal, one of the plurality of clock signals being provided to the first conducting terminal, and the second conducting terminal being connected to the first output node;

a first output control node connected to the control terminal of the first output control transistor;

a first output control node turn-on unit configured to change a level of the first output control node toward an on level based on a shift pulse output from the preceding stage; and a first output control node turn-off unit configured to change the level of the first output control node toward an off level based on a shift pulse output from the succeeding stage, wherein the second unit circuit includes:

a second output node connected to a succeeding stage;

a second output control transistor including a control terminal, a first conducting terminal, and a second conducting terminal, a signal changing from the off level to the on level at a timing slightly before resumption of the shift action after stoppage of the shift action being provided to the first conducting terminal, and the second conducting terminal being connected to the second output node;

a second output control node connected to the control terminal of the second output control transistor;

a second output control node turn-on unit configured to change a level of the second output control node toward the on level based on a shift pulse output from the preceding stage; and a second output control node turn-off unit configured to change the level of the second output control node toward the off level based on the signal changing from the off level to the on level at a timing for resumption of the shift action after stoppage of the shift action.

According to a third aspect of the present invention, based on the second aspect of the present invention, the first unit circuit further includes a first output control node stabilizing unit configured to prevent a variation in a level of the first output control node during a period when the level of the first output control node is to be maintained at the off level, and the second unit circuit further includes a second output control node stabilizing unit configured to prevent a variation in a level of the second output control node during a period when the level of the second output control node is to be maintained at the off level.

According to a fourth aspect of the present invention, based on the second aspect of the present invention, the first unit circuit further includes a first output node stabilizing unit configured to prevent a variation in a level of the first output node during a period when the level of the first output node is to be maintained at the off level, and the second unit circuit further includes a second output node stabilizing unit configured to prevent a variation in a level of the second output node during a period when the level of the second output node is to be maintained at the off level.

According to a fifth aspect of the present invention, based on the second aspect of the present invention, the first unit circuit further includes:

a first output control node stabilizing unit configured to prevent a variation in a level of the first output control node during a period when the level of the first output control node is to be maintained at the off level; and a first output node stabilizing unit configured to prevent a variation in a level of the first output node during a period when the level of the first output node is to be maintained at the off level, and the second unit circuit further includes:

a second output control node stabilizing unit configured to prevent a variation in the level of the second output control node during a period when the level of the second output control node is to be maintained at the off level; and a second output node stabilizing unit configured to prevent a variation in the level of the second output node during a period when the level of the second output node is to be maintained at the off level.

According to a sixth aspect of the present invention, based on the second aspect of the present invention, the first unit circuit further includes:

a first output control node off maintaining transistor including a control terminal, a first conducting terminal, and a second conducting terminal, a signal maintained at the on level substantially throughout a period when the shift action is stopped being provided to the first conducting terminal, the first conducting terminal being connected to the first output control node, an off level potential being provided to the second conducting terminal; and a first output node off maintaining transistor including a control terminal, a first conducting terminal, and a second conducting terminal, a signal maintained at the on level substantially throughout the period when the shift action is stopped being provided to the first conducting terminal, and the first conducting terminal being connected to the first output node, and the off level potential being provided to the second conducting terminal.

According to a seventh aspect of the present invention, based on the second aspect of the present invention, the second unit circuit further includes:

a second output control node off maintaining transistor including a control terminal, a first conducting terminal, and a second conducting terminal, a signal maintained at the on level substantially throughout a period when the shift action is being performed being provided to the first conducting terminal, the first conducting terminal being connected to the second output control node, an off level potential being provided to the second conducting terminal; and a second output node off maintaining transistor including a control terminal, a first conducting terminal, and a second conducting terminal, a signal maintained at the on level substantially throughout the period when the shift action is being performed being provided to the first conducting terminal, the first conducting terminal being connected to the second output node, and the off level potential being provided to the second conducting terminal.

According to an eighth aspect of the present invention, based on the second aspect of the present invention, the first unit circuit further includes:

a first output control node off maintaining transistor including a control terminal, a first conducting terminal, and a second conducting terminal, a signal maintained at the on level substantially throughout a period when the shift action is stopped being provided to the first conducting terminal, the first conducting terminal being connected to the first output control node, and an off level potential being provided to the second conducting terminal; and a first output node off maintaining transistor including a control terminal, a first conducting terminal, and a second conducting terminal, a signal maintained at the on level substantially throughout the period when the shift action is stopped being provided to the first conducting terminal, the first conducting terminal being connected to the first output node, and the off level potential being provided to the second conducting terminal, and the second unit circuit further includes:

a second output control node off maintaining transistor including a control terminal, a first conducting terminal, and a second conducting terminal, a signal maintained at the on level substantially throughout a period when the shift action is being performed being provided to the first conducting terminal, the first conducting terminal being connected to the second output control node, and an off level potential being provided to the second conducting terminal; and a second output node off maintaining transistor including a control terminal, a first conducting terminal, and a second conducting terminal, a signal maintained at the on level substantially throughout the period when the shift action is being performed being provided to the first conducting terminal, the first conducting terminal being connected to the second output node, and the off level potential being provided to the second conducting terminal.

According to a ninth aspect of the present invention, based on the second aspect of the present invention, the first output control node turn-on unit includes a first output control node turn-on transistor including a control terminal, a first conducting terminal, and a second conducting terminal, a shift pulse output from the preceding stage being provided to the control terminal and the first conducting terminal, and the second conducting terminal being connected to the first output control node, the first output control node turn-off unit includes a first output control node turn-off transistor including a control terminal, a first conducting terminal, and a second conducting terminal, a shift pulse output from the succeeding stage being provided to the control terminal, the first conducting terminal being connected to the first output control node, and the off level potential being provided to the second conducting terminal, the second output control node turn-on unit includes a second output control node turn-on transistor including a control terminal, a first conducting terminal, and a second conducting terminal, a shift pulse output from the preceding stage being provided to the control terminal and the first conducting terminal, and the second conducting terminal being connected to the second output control node, and the second output control node turn-off unit includes a second output control node turn-off transistor including a control terminal, a first conducting terminal, and a second conducting terminal, a signal changing from the off level to the on level at a timing when the shift action is resumed after stoppage of the shift action being provided to the control terminal, the first conducting terminal being connected to the second output control node, and the off level potential being provided to the second conducting terminal.

According to a tenth aspect of the present invention, based on the ninth aspect of the present invention, when sizes of the first output control node turn-on transistor, the first output control node turn-off transistor, the first output control transistor, the second output control node turn-on transistor, the second output control node turn-off transistor, and the second output control transistor are denoted by $S(T1a)$, $S(T2a)$, $S(T3a)$, $S(T1b)$, $S(T2b)$, and $S(T3b)$, respectively, at least one of Relationships (1) to (3) below is satisfied.

$$S(T1a) > S(T1b) \quad (1)$$

$$S(T2a) > S(T2b) \quad (2)$$

$$S(T3a) > S(T3b) \quad (3)$$

According to an eleventh aspect of the present invention, based on the ninth aspect of the present invention, when sizes of the first output control node turn-on transistor, the first output control node turn-off transistor, the first output control transistor, the second output control node turn-on transistor, the second output control node turn-off transistor, and the second output control transistor are denoted by $S(T1a)$, $S(T2a)$, $S(T3a)$, $S(T1b)$, $S(T2b)$, and $S(T3b)$, respectively, all of Relationships (1) to (3) below are satisfied.

$$S(T1a) > S(T1b) \quad (1)$$

$$S(T2a) > S(T2b) \quad (2)$$

$$S(T3a) > S(T3b) \quad (3)$$

According to a twelfth aspect of the present invention, based on the eleventh aspect of the present invention, the first unit circuit further includes a first capacity including a first end connected to the first output control node and a second end connected to the first output node, the second unit circuit further includes a second capacity including a first end connected to the second output control node and a second end connected to the second output node, and when capacitances of the first capacity and the second capacity are denoted by $C(C1a)$ and $C(C1b)$, respectively, Relationship (4) below is satisfied.

$$C(C1a) > C(C1b) \quad (4)$$

A thirteenth aspect of the present invention is a display device including:

a display unit with the plurality of scanning signal lines disposed; and the shift register according to the first aspect of the present invention.

According to a fourteenth aspect of the present invention, based on the thirteenth aspect of the present invention, a touch panel integrated with the display unit is provided, wherein processing on the touch panel is executed while the shift action is stopped.

According to a fifteenth aspect of the present invention, based on the fourteenth aspect of the present invention, a signal output from the second output node included in the second unit circuit is provided to the touch panel.

According to a sixteenth aspect of the present invention, based on the fourteenth aspect of the present invention, the transistors included in the plurality of unit circuits are each a thin film transistor including an oxide semiconductor layer.

According to a seventeenth aspect of the present invention, based on the sixteenth aspect of the present invention, the thin film transistor is a channel etched thin film transistor.

According to an eighteenth aspect of the present invention, based on the sixteenth aspect of the present invention, the oxide semiconductor layer contains indium gallium zinc oxide.

According to a nineteenth aspect of the present invention, based on the sixteenth aspect of the present invention, the oxide semiconductor layer includes a crystal oxide semiconductor.

According to a twentieth aspect of the present invention, based on the sixteenth aspect of the present invention, the oxide semiconductor layer includes a layered structure.

A twenty-first aspect of the present invention is a method for driving a shift register to drive a plurality of scanning signal lines by performing a shift action based on a plurality of clock signals, the shift register including a plurality of stages, the method including:

stopping the shift action; and resuming the shift action after stoppage of the shift operation;

wherein a plurality of unit circuits each constituting corresponding one of the plurality of stages, the unit circuits each includes:

first unit circuits each connected to one of the plurality of scanning signal lines and configured to output a shift pulse to the connected scanning signal line and to a succeeding stage; and second unit circuits each connected to none of the plurality of scanning signal lines and configured to output a shift pulse to a succeeding stage, clock actions of the plurality of clock signals are stopped with the shift pulse provided to the second unit circuit in the stopping of the shift action, and the clock actions of the plurality of clock signals are resumed after the shift pulse is output from the second unit circuit to the succeeding stage, in the resuming of the shift action.

Advantageous Effects of Invention

According to the first aspect of the present invention, the shift register includes the first unit circuits and the second unit circuits, and each of the second unit circuits is connected to none of the scanning signal lines. Thus, the display quality is not affected by a significant threshold shift that may occur in the transistors in the second unit circuits. This may reduce the display failure resulting from interruption of a scan (sequential selection of each scanning signal line starting with the first scanning signal line and ending with the final scanning signal line). As described above, a shift register is realized that can interrupt the scan without causing a display failure.

According to the second aspect of the present invention, actions of the second unit circuit need only two signals (a signal changing from the off level to the on level at a timing slightly before resumption of the shift action and a signal changing from the off level to the on level at a timing for resuming the shift action) in addition to signals used in the related art. In other words, compared to the related art, the second aspect enables scan interruption simply by providing the two new signals.

According to the third aspect of the present invention, in the first unit circuit, the level of the first output control node is maintained at the off level during the periods other than select periods (the periods when a connection target scanning signal line is in a select state), and in the second unit circuit, the level of the second output control node is maintained at the off level during a period when a scan is being performed. Consequently, even in a case where noise is mixed in the first output control node or the second output control node, an abnormal action caused by the noise is suppressed.

According to the fourth aspect of the present invention, in the first unit circuit, the level of the first output node is maintained at the off level during the periods other than the select periods (the periods when the connection target scanning signal line is in the select state), and in the second unit circuit, the level of the second output node is maintained at the off level during the period when a scan is being performed. Consequently, even in a case where noise is mixed in the first output node or the second output node, an abnormal action caused by the noise is suppressed.

According to the fifth aspect of the present invention, a shift register is realized that achieves effects of both the third and fourth aspects of the present invention.

According to the sixth aspect of the present invention, in all the first unit circuits, the first output control node off maintaining transistor and the first output node off maintaining transistor are in an on state while the scan is stopped. Thus, potentials of both the first output control node and the first output node may be maintained at the off level while the scan is stopped. This reduces an abnormal action attributed to noise caused by coupling of parasitic capacitance or the like (for example, an abnormal action attributed to turn-on of a pixel TFT resulting from an increase in the potential of the first output node).

According to the seventh aspect of the present invention, in all the second unit circuits, the second output control node off maintaining transistor and the second output node off maintaining transistor are in the on state while the scan is performed. Thus, potentials of the second output control node and the first output node may be maintained at the off level while the scan is being performed. This enables prevention of output of an incorrect shift pulse from the second unit circuit to the first unit circuit at the succeeding stage while the scan is being performed.

According to the eighth aspect of the present invention, effects of both the sixth and seventh aspects of the present invention may be achieved. Consequently, a shift register is realized that can interrupt the scan without causing a display failure or an abnormal action.

According to the ninth aspect of the present invention, effects similar to those of the second aspect of the present invention are produced.

The tenth aspect of the present invention allows suppression of an increase in the area of the shift register associated with addition of a circuit configured to enable scan interruption.

The eleventh aspect of the present invention allows effective suppression of an increase in the area of the shift register associated with addition of the circuit configured to enable scan interruption.

The twelfth aspect of the present invention allows effective suppression of an increase in the area of the shift register associated with addition of the circuit configured to enable scan interruption.

According to the thirteenth aspect of the present invention, a display device is realized that includes a shift register producing effects similar to those of the first aspect of the present invention.

According to the fourteenth aspect of the present invention, in the display device including the touch panel, scanning through the scanning signal lines and processing on the touch panel may be efficiently executed without causing a display failure.

According to the fifteenth aspect of the present invention, signals output from the second unit circuit can be efficiently utilized.

The sixteenth aspect of the present invention enables a reduction in the size of the display device including the shift register producing effects similar to those of the first aspect of the present invention and also a reduction in power consumption of the display device.

According to the seventeenth aspect of the present invention, effects similar to those of the sixteenth aspect of the present invention are produced.

According to the eighteenth aspect of the present invention, effects similar to those of the sixteenth aspect of the present invention are produced.

According to the nineteenth aspect of the present invention, effects similar to those of the sixteenth aspect of the present invention are produced.

According to the twentieth aspect of the present invention, effects similar to those of the sixteenth aspect of the present invention are produced.

According to the twenty-first aspect of the present invention, the method for driving a shift register is allowed to produce effects similar to those of the first aspect of the present invention.

DESCRIPTION OF EMBODIMENTS

Embodiments of the present invention will be described below with reference to the accompanying drawings. In the description below, a gate terminal (gate electrode) of a thin film transistor corresponds to a control terminal, a drain terminal (drain electrode) of the thin film transistor corresponds to a first conducting terminal, and a source terminal (source electrode) of the thin film transistor corresponds to a second conducting terminal. In regard to potentials of signals and the like, a high level corresponds to an on level, and a low level corresponds to an off level. In general, one of the terminals corresponding to the drain and the source that has a higher potential is referred to as the drain. However, in the description herein, one of the corresponding terminals is defined as a drain and the other is defined as a source. Thus, a source potential may be higher than a drain potential in some cases.

1. First Embodiment 1.1 General Configuration and Action Outline

Figure 2:
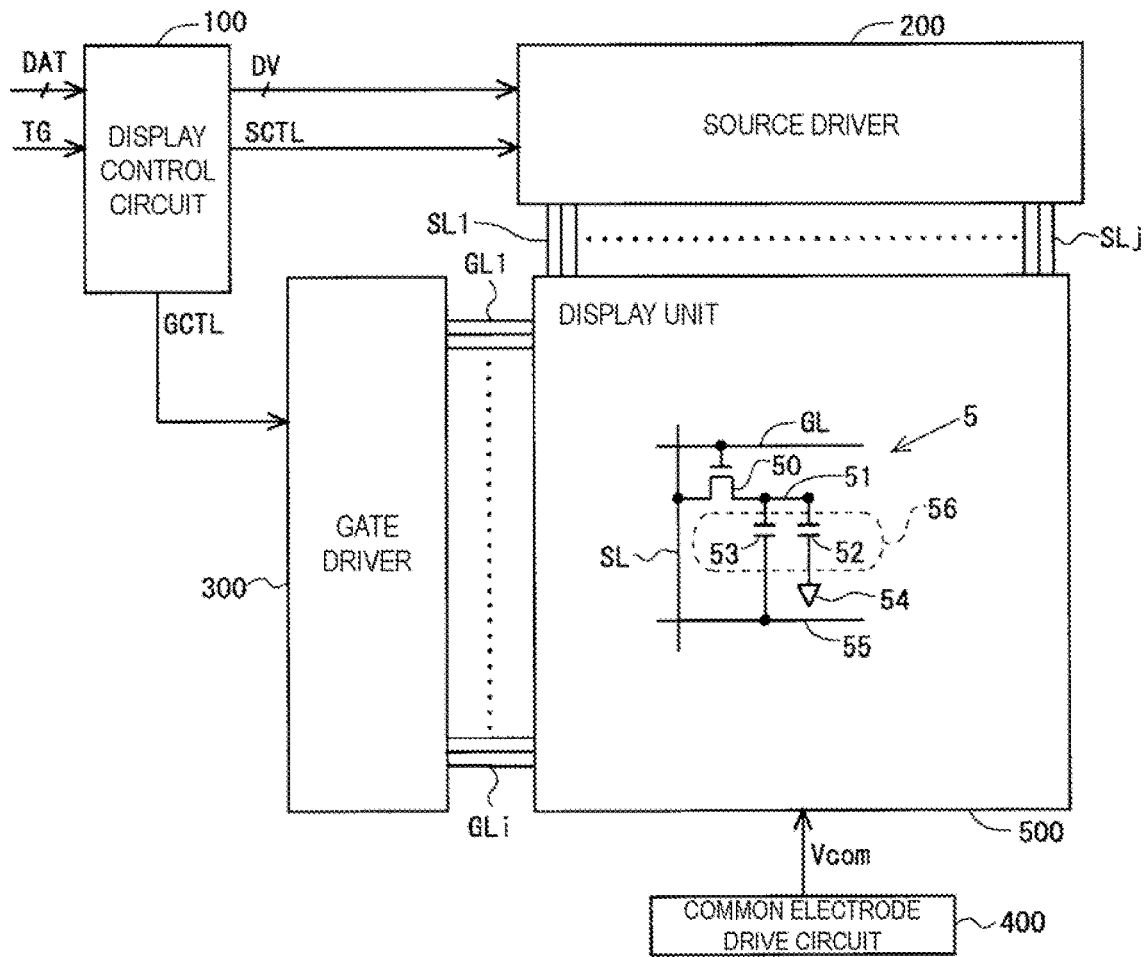
FIG. 2 is a block diagram illustrating a general configuration of the liquid crystal display device according to the first embodiment.

FIG. 2 is a block diagram illustrating a general configuration of an active-matrix liquid crystal display device according to a first embodiment of the present invention. As illustrated in FIG. 2, the liquid crystal display device includes a display control circuit 100, a source driver (video signal line drive circuit) 200, a gate driver (scanning signal line drive circuit) 300, a common electrode drive circuit 400, and a display unit 500. In the present embodiment, the gate driver 300 and the display unit 500 are formed on the same substrate (a TFT substrate including one of two substrates constituting a liquid crystal panel). In other words, the gate driver 300 according to the present embodiment includes a monolithic gate driver. In the present embodiment, the liquid crystal panel constituting the display unit 500 is assumed to be integrated with a touch panel.

The display unit 500 includes a plurality of (j) source bus lines (video signal lines) SL1 to SLj and a plurality of (i) gate bus lines (scanning signal lines) GL1 to GLi disposed therein. Pixel forming units 5 forming respective pixels are each provided in association with an intersection between a corresponding one of the source bus lines SL1 to SLj and a corresponding one of the gate bus lines GL1 to GLj. In other words, the display unit 500 includes a plurality of (i×j) pixel forming units 5. The plurality of pixel forming units 5 are arranged in a matrix to constitute a pixel matrix (pixel array) with i rows and j columns. For the gate bus lines, reference character GL is used when no particular row needs to be specified. Similarly, for the source bus lines, reference character SL is used when no particular column needs to be specified. Each of the pixel forming units 5 includes a thin film transistor (TFT) 50 including a switching element with a gate terminal connected to the gate bus line GL routed through the corresponding intersection and a source terminal connected to the source bus line SL routed through the intersection, a pixel electrode 51 connected to a drain terminal of the thin film transistor 50, a common electrode 54 and an auxiliary capacitive electrode 55 provided commonly for the plurality of pixel forming units 5, a liquid crystal capacity 52 formed of a pixel electrode 51 and a common electrode 54, and an auxiliary capacity 53 formed of the pixel electrode 51 and an auxiliary capacitive electrode 55. The pixel capacity 56 is constituted of the liquid crystal capacity 52 and the auxiliary capacity 53. In the display unit 500 in FIG. 2, only the components corresponding to one pixel forming unit 5 is illustrated.

In this case, a configuration (for example, the configuration disclosed in WO 2014/069529) may be adopted where at least a part of the gate driver 300 is provided in the pixel array (in the display unit 500). Then, waveform rounding of scanning signals provided to the gate bus lines GL1 to GLj may be suppressed to allow the gate bus lines GL1 to GLj to be driven at high speed.

According to the present embodiment, all the thin film transistors 50 in the pixel forming unit 5 are of an n channel type. According to the present embodiment, an oxide TFT (a thin film transistor including an oxide semiconductor as a channel layer) is adopted as the thin film transistor 50. According to the present embodiment, a channel etched type structure is adopted for the thin film transistor 50. However, an etch stop type may be adopted. The above-described structure also applies to the thin film transistors in the gate driver 300.

Figure 3:
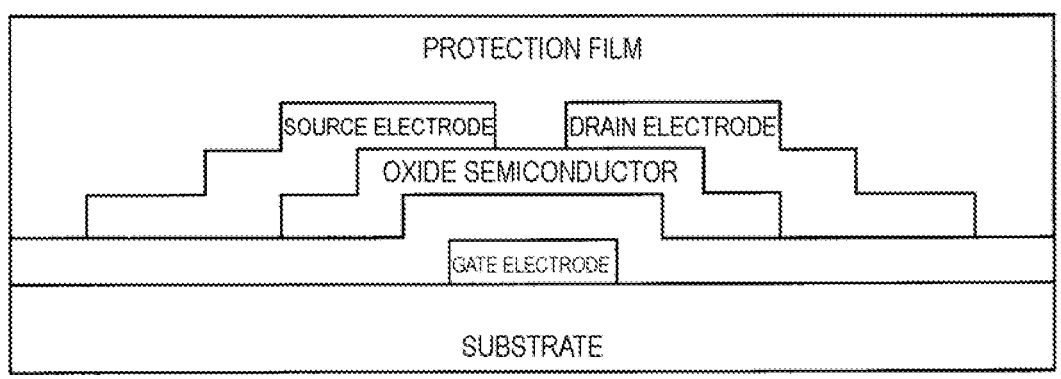
FIG. 3 is a diagram illustrating an example of a structure of a channel etched TFT according to the first embodiment.

Here, the channel etched type and the etch stop type will be described. In the "channel etched type TFT", for example, as illustrated in FIG. 3, no etch stop layer is formed on a channel region, and lower faces of channel-side end portions of the source electrode and the drain electrode are arranged in contact with an upper face of the oxide semiconductor layer. The channel etched type TFT is formed, for example, by forming a conductive film for the source and drain electrodes on the oxide semiconductor layer and separating the conductive film into the source and the drain. In separating the source and drain, a surface portion of the channel region may be etched.

On the other hand, in the "etch stop type TFT" (a TFT including an etch stop layer formed on the channel region), the lower faces of the channel-side end portions of the source electrode and the drain electrode are positioned, for example, on the etch stop layer. The etch stop type TFT is formed, for example, by forming an etch stop layer covering a portion of the oxide semiconductor layer, the position corresponding to the channel region, then forming a conductive film for the source and drain electrodes on the oxide semiconductor layer and the etch stop layer, and separating the conductive film into the source and the drain.

Now, the oxide semiconductor will be described. The oxide semiconductor included in the oxide semiconductor layer may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor having a c axis oriented substantially perpendicular to a layer face.

The oxide semiconductor layer may include a layered structure with two or more layers. When the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers with different crystal structures. The oxide semiconductor layer may include a plurality of amorphous oxide semiconductor layers. When the oxide semiconductor layer includes a two-layer structure including an upper layer and a lower layer, the oxide semiconductor included in the upper layer preferably has a larger energy gap than an energy gap of the oxide semiconductor included in the lower layer. However, when the difference in energy gap between the upper layer and the lower layer is relatively small, the oxide semiconductor in the lower layer may have a larger energy gap than an energy gap of the oxide semiconductor in the upper layer.

Materials, structures, and film formation methods for the amorphous oxide semiconductor and the above-described crystalline oxide semiconductors, a configuration of the oxide semiconductor layer with the layered structure, and the like are described, for example, in JP 2014-007399 A.

The oxide semiconductor layer may contain, for example, at least one metal elements from In (indium), Ga (gallium), and Zn (zinc). According to the present embodiment, the oxide semiconductor layer contains, for example, an In—Ga—Zn—O-based semiconductor (for example, indium gallium zinc oxide). The In—Ga—Zn—O-based semiconductor includes a ternary oxide with In, Ga, and Zn. The ratio of In to Ga to Zn (composition ratio) is not particularly limited. For example, the ratio such as In:Ga:Zn=2:2:1, In:Ga:Zn=1:1:1, or In:Ga:Zn=1:1:2 may be adopted. Such an oxide semiconductor layer may be formed of an oxide semiconductor film including an In—Ga—Zn—O-based semiconductor. A channel etched type TFT having an active layer including an oxide semiconductor (OS) such as an In—Ga—Zn—O-based semiconductor may be referred to as a "CE-OS-TFT".

The In—Ga—Zn—O-based semiconductor may be amorphous or crystalline. As the crystalline In—Ga—Zn—O-based semiconductor, a crystalline In—Ga—Zn—O-based semiconductor having the c axis oriented substantially perpendicular to the layer face is preferably adopted.

The crystal structure of the crystalline In—Ga—Zn—O-based semiconductor is disclosed, for example, in JP 2014-007399 A, JP 2012-134475 A, JP 2014-209727 A, and the like. The TFT including the In—Ga—Zn—O-based semiconductor layer is preferably used as a drive TFT (for example, the thin film transistors in the above-described gate driver 300) and as a pixel TFT (the above-described thin film transistors 50) because of its high mobility (the TFT having greater than 20 times higher mobility than a-Si TFT) and its low leak current (the leak current in the TFT is less than one-hundredth of the leak current in a-Si TFT).

In place of the In—Ga—Zn—O-based semiconductor, the oxide semiconductor layer may contain another oxide semiconductor. The oxide semiconductor layer may contain, for example, an In—Sn—Zn—O-based semiconductor (for example, $In_2O_3$—$SnO_2$—ZnO; InSnZnO). The In—Sn—Zn—O-based semiconductor contains a ternary oxide with In (indium), Sn (tin), and Zn (zinc). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, or an Hf—In—Zn—O-based semiconductor.

In regard to the components illustrated in FIG. 2, the display control circuit unit 100 receives an image signal DAT and a group of timing signals TG such as a horizontal synchronizing signal and a vertical synchronizing signal transmitted from outside, and outputs a digital video signal DV, a source control signal SCTL for controlling actions of the source driver 200, and a gate control signal GCTL for controlling actions of the gate driver 300. The source control signal SCTL includes a source start pulse signal, a source clock signal, and a latch strobe signal. The gate control signal GCTL will be described below.

The source driver 200 receives the digital video signal DV and the source control signal SCTL output from the display control circuit unit 100 and applies the driving video signal to each of the source bus lines SL1 to SLj. At this time, the source driver 200 sequentially holds the digital video signals DV indicative of respective voltages to be applied to the corresponding source bus lines SL at timings when pulses of the source clock signal are generated. At a timing when a pulse of the latch strobe signal is generated, the held digital video signals DV are converted into analog voltages. The resultant analog voltages are concurrently applied to all of the source bus lines SL as the driving video signal. The gate driver 300 sequentially applies active scanning signals to the gate bus lines GL1 to GLi one by one (sequentially selects the gate bus lines GL1 to GLi one by one) based on the gate control signal GCTL output from the display control circuit unit 100. In other words, the gate driver 300 scans the gate bus lines GL. Then, the scan is interrupted at a predetermined timing. The gate driver 300 will be described below in detail. The common electrode drive circuit 400 provides a predetermined potential Vcom to a common electrode 54c.

As described above, the driving video signal is applied to each of the source bus lines SL1 to SLj, the scanning signal is applied to each of the gate bus lines GL1 to GLi, and the predetermined potential Vcom is provided to the common electrode 54. As a result, an image based on the image signal DAT transmitted from outside is displayed on the display unit 500.

1.2 Configuration of the Gate Driver

Figure 1:
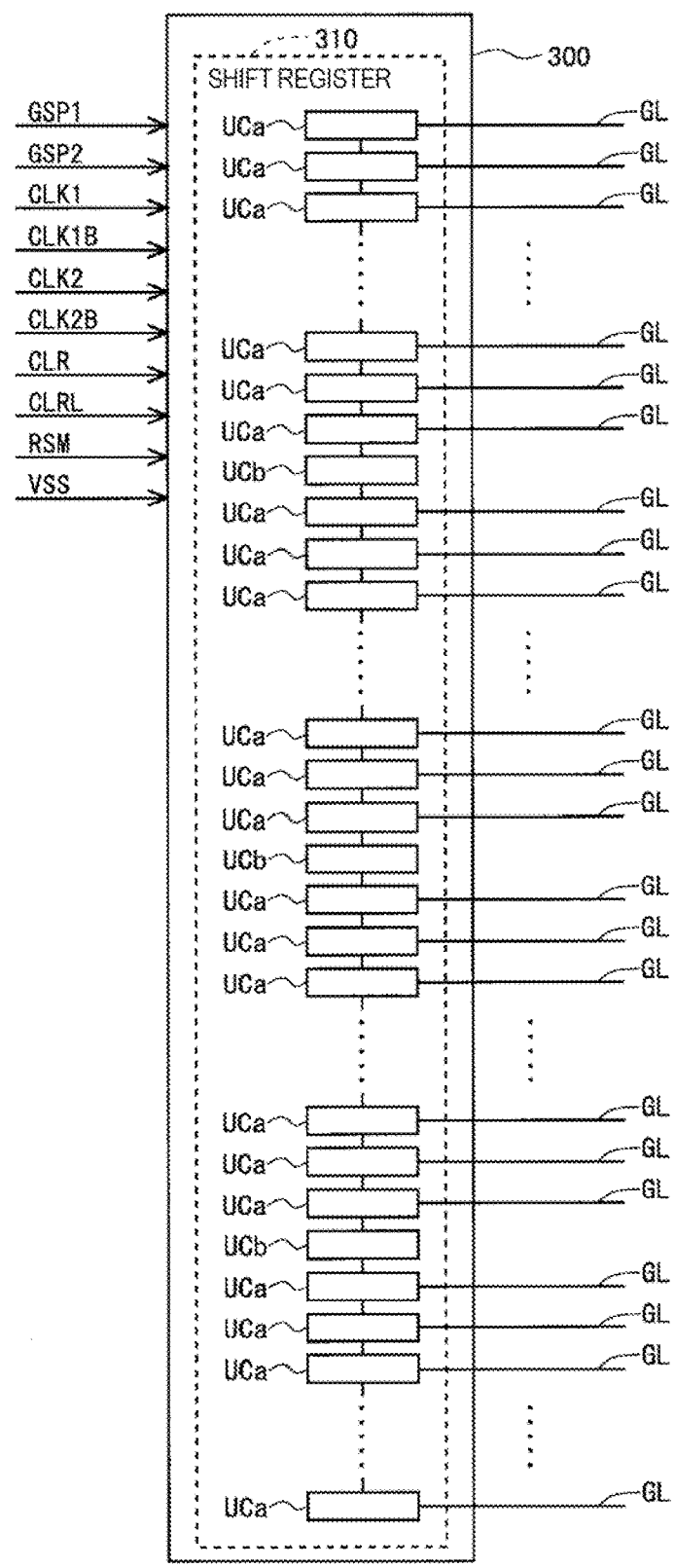
FIG. 1 is a schematic configuration diagram of a gate driver in a liquid crystal display device according to a first embodiment of the present invention.

Now, with reference to FIG. 1, FIG. 4, and FIG. 5, a configuration of the gate driver 300 according to the present embodiment will be described. As illustrated in FIG. 1, the gate driver 300 is constituted of a shift register 310 including a plurality of stages. According to the present embodiment, the shift register 310 includes first unit circuits UCa including unit circuits connected to the respective gate bus lines GL and second unit circuits UCb including unit circuits not connected to the gate bus lines GL. The gate bus lines GL are sequentially scanned one by one from the first line until the i-th line. The second unit circuits UCb are provided to enable such a scan to be interrupted. For example, when the scan is interrupted after the 50th gate bus line GL50 is selected and after the 100th gate bus line is selected, the second unit circuit UCb is provided between the first unit circuit UCa corresponding to the 50th gate bus line GL50 and the first unit circuit UCa corresponding to the 51st gate bus line and between the first unit circuit UCa corresponding to the 100th gate bus line GL100 and the first unit circuit UCa corresponding to the 101st gate bus line.

As illustrated in FIG. 1, to the gate driver 300, two gate start pulse signals GSP1 and GSP2, four gate clock signals CLK1, CLK1B, CLK2, and CLK2B, three signals CLR, CLRL, and RSM related to scan interruption, and a low level power source voltage VSS are provided. The magnitude of a potential provided based on the low level power source voltage VSS is referred to as a "VSS potential" for convenience.

Figure 4:
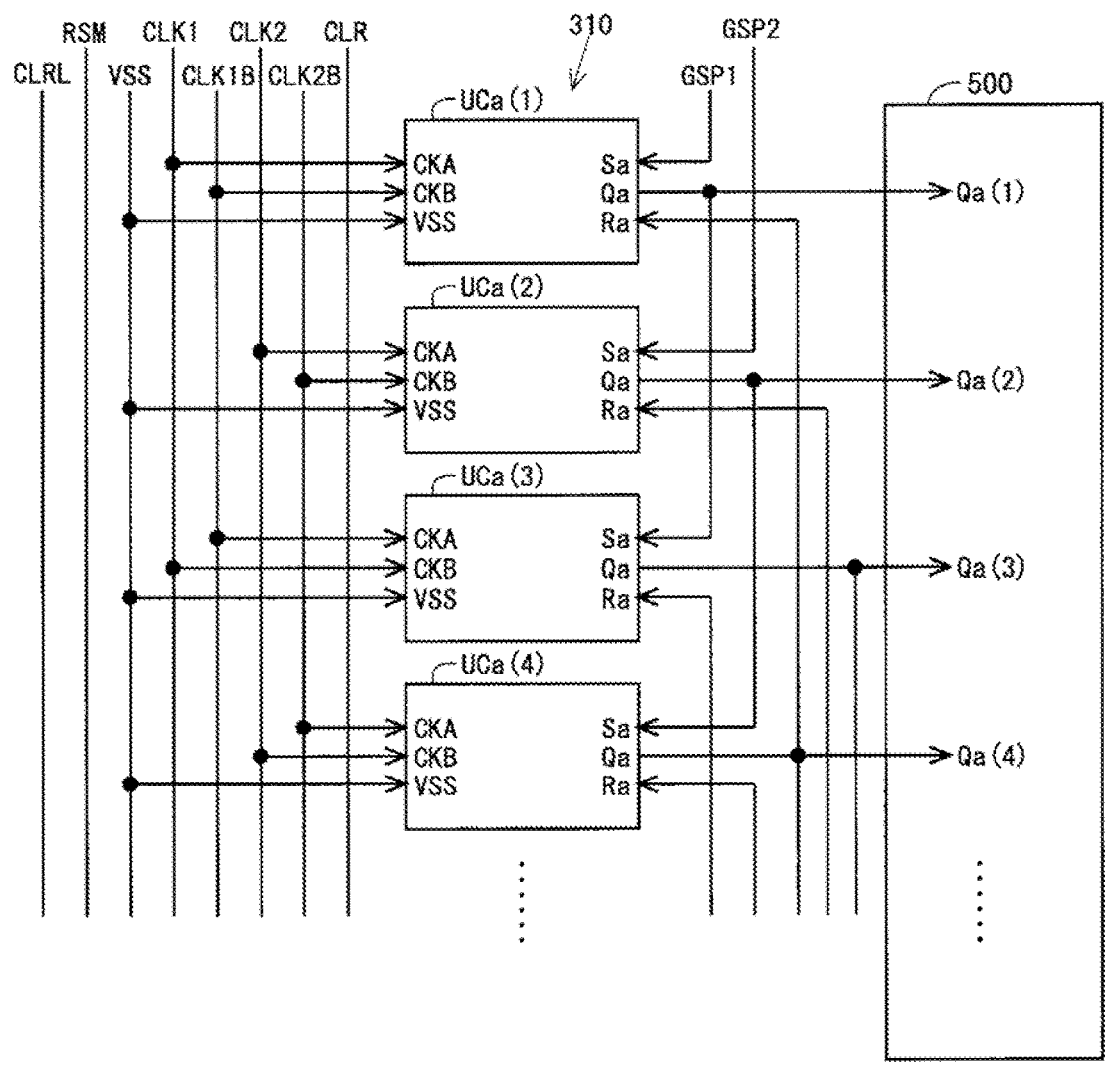
FIG. 4 is a block diagram illustrating a configuration of a shift register in the gate driver according to the first embodiment.
Figure 5:
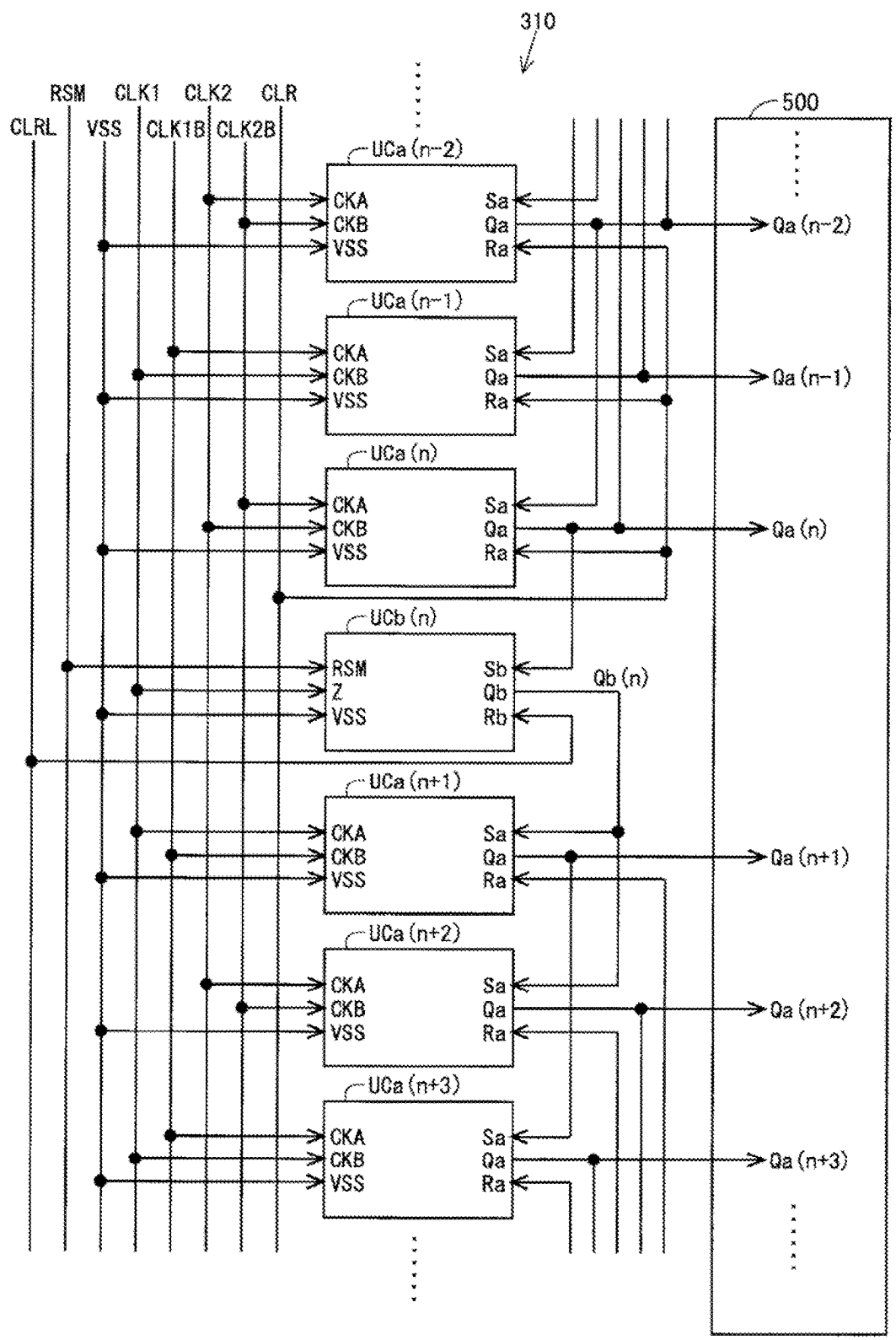
FIG. 5 is a block diagram illustrating a configuration of the shift register in the gate driver according to the first embodiment.

FIG. 4 and FIG. 5 are block diagrams illustrating a configuration of the shift register 310 in the gate driver 300 according to the present embodiment. Here, the scan is assumed to be interrupted after the n-th gate bus line GLn is selected. FIG. 4 is a diagram illustrating a configuration of the first unit circuits UCa arranged at positions other than those at and near the second unit circuits UCb. FIG. 5 is a diagram illustrating a configuration of the second unit circuit UCb and the first unit circuits UCa arranged near the second unit circuit UCb. FIG. 4 illustrates the first unit circuits UCa(1) to UCa(4) corresponding to the first to fourth gate bus lines GL1 to GL4. FIG. 5 illustrates a second unit circuit UCb(n), the first unit circuits UCa(n−2) to UCa(n) corresponding to the (n−2)-th to n-th gate bus lines GLn-2 to GLn, and the first unit circuits UCa(n+1) to UCa(n+3) corresponding to the (n+1)th to (n+3)th gate bus lines GL(n+1) to GL(n+3).

As illustrated in FIG. 4 and FIG. 5, each first unit circuit UCa is provided with an input terminal configured to receive a first clock signal CKA and a second clock signal CKB constituting a two-phase clock signal, an input terminal configured to receive the low level power source voltage VSS, an input terminal configured to receive a set signal Sa, an input terminal configured to receive a reset signal Ra, and an output terminal configured to output an output signal (shift pulse) Qa.

First, the signals provided to the input terminals of each first unit circuit UCa will be described. The low level power source voltage VSS is provided commonly to all of the first unit circuits UCa(1) to UCa(i).

The first clock signal CKA and the second clock signal CKB are provided to the first unit circuits UCa as follows. For the first unit circuit UCa(1), the gate clock signal CLK1 is provided as the first clock signal CKA, and the gate clock signal CLK1B is provided as the second clock signal CKB. For the first unit circuit UCa(2), the gate clock signal CLK2 is provided as the first clock signal CKA, the gate clock signal CLK2B is provided as the second clock signal CKB. For the first unit circuit UCa(3), the gate clock signal CLK1B is provided as the first clock signal CKA, the gate clock signal CLK1 is provided as the second clock signal CKB. For the first unit circuit UCa(4), the gate clock signal CLK2B is provided as the first clock signal CKA, and the gate clock signal CLK2 is provided as the second clock signal CKB. The above-described configuration is repeated for every four stages.

Figure 6:
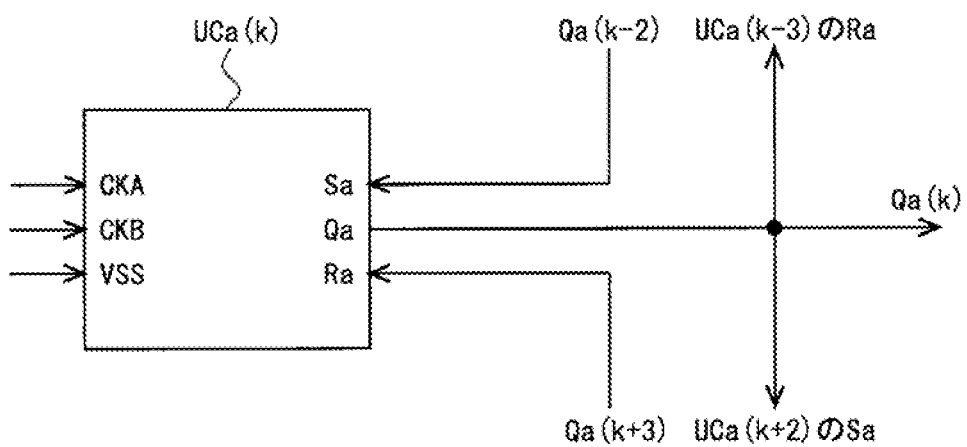
FIG. 6 is a diagram illustrating input signals to and an output signal from a first unit circuit according to the first embodiment.

The set signal Sa is provided to the first unit circuits UCa as follows (see FIG. 6). For the first unit circuit UCa(k) corresponding to the kth (k is an integer of 1 or greater and i or less) gate bus line GLk, an output signal Qa(k−2) from the first unit circuit UCa(k−2), two stages earlier than the first unit circuit (k), is provided as the set signal Sa. However, for the first unit circuit UCa(1), a gate start pulse signal GSP1 is provided as the set signal Sa, and for the first unit circuit UCa(2), a gate start pulse signal GSP2 is provided as the set signal Sa. For the first unit circuit UCa(n+1) and the first unit circuit UCa(n+2), an output signal Qb(n) from the second unit circuit UCb(n) is provided as the set signal Sa. The first unit circuit UCa(2) may be configured in which the gate start pulse signal GSP1 is provided as the set signal Sa in place of the gate start signal GSP2.

The reset signal Ra is provided to the first unit circuits UCa as follows (see FIG. 6). For the first unit circuit UCa(k) corresponding to the kth gate bus line GLk, an output signal Qa(k+3) from the first unit circuit UCa(k+3), three stages later than the first unit circuit (k), is provided as the reset signal Ra. However, for the first unit circuit UCa(n−2), the first unit circuit UCa(n−1), the first unit circuit UCa(n), the first unit circuit UCa(i−2), the first unit circuit UCa(i−1), and the first unit circuit UCa(i), the signal CLR is provided as the reset signal Ra.

Now, the signals provided to the input terminals of each second unit circuit UCb(n) will be described. The signal CLRL is provided as a reset signal Rb, the gate clock signal CLK1 is provided as a control signal Z, an output signal Qa(n) from the first unit circuit UCa(n) is provided as a set signal Sb, and the signal RSM and the low level power source voltage VSS are also provided.

The output signal from each second unit circuit UCb may be provided to the touch panel and utilized for processing on the touch panel. This enables the output signal from the second unit circuit UCb to be efficiently utilized.

1.3 Configuration of the Unit Circuit

1.3.1 First Unit Circuit

Figure 7:
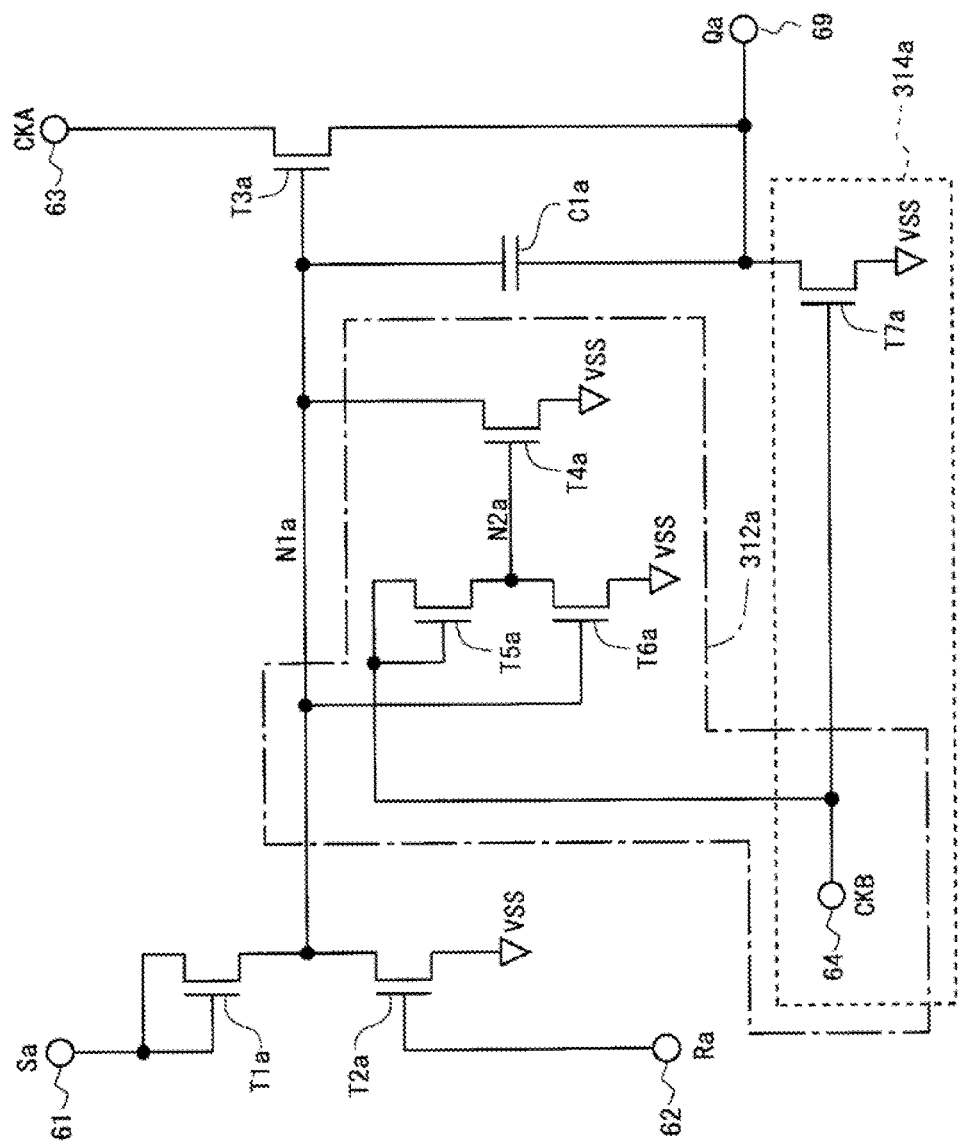
FIG. 7 is a circuit diagram illustrating a configuration of the first unit circuit according to the first embodiment.

FIG. 7 is a circuit diagram illustrating a configuration of the first unit circuit UCa according to the present embodiment. The first unit circuit UCa includes seven thin film transistors T1a to T7a and one capacitor C1a. The first unit circuit UCa includes four input terminals 61 to 64 and one output terminal 69, in addition to an input terminal for the low level power source voltage VSS. The input terminal receiving the set signal Sa is denoted by reference numeral 61, the input terminal receiving the reset signal Ra is denoted by reference numeral 62, the input terminal receiving the first clock signal CKA is denoted by reference numeral 63, and the input terminal receiving the second clock signal CKB is denoted by reference numeral 64. The output terminal outputting the output signal Qa is denoted by reference numeral 69. Connection related to the components in the first unit circuit UCa will be described below.

A source terminal of the thin film transistor T1a, a drain terminal of the thin film transistor T2a, a gate terminal of the thin film transistor T3a, a drain terminal of the thin film transistor T4a, and a gate terminal of the thin film transistor T6a are connected together. An interior node where these terminals are connected together is denoted by reference character N1a. A gate terminal of the thin film transistor T4a, a source terminal of the thin film transistor T5a, and a drain terminal of the thin film transistor T6a are connected together. An interior node where these terminals are connected together is denoted by reference character N2a.

The thin film transistor T1a includes a gate terminal and a drain terminal both connected to the input terminal 61 (in other words, the thin film transistor T1a is diode-connected) and the source terminal connected to the interior node N1a. The thin film transistor T2a includes a gate terminal connected to the input terminal 62, the drain terminal connected to the interior node N1a, and a source terminal connected to the input terminal for the power source voltage VSS. The thin film transistor T3a includes the gate terminal connected to the interior node N1a, a drain terminal connected to the input terminal 63, and a source terminal connected to the output terminal 69. The thin film transistor T4a includes the gate terminal connected to the node N2a, the drain terminal connected to the interior node N1a, and a source terminal connected to the input terminal for the power source voltage VSS. The thin film transistor T5a includes a gate terminal and a drain terminal both connected to the input terminal 64 (in other words, the thin film transistor T5a is diode-connected), and the source terminal connected to the node N2a. The thin film transistor T6a includes the gate terminal connected to the interior node N1a, the drain terminal connected to the node N2a, and a source terminal connected to the input terminal for the power source voltage VSS. The thin film transistor T7a includes a gate terminal connected to the input terminal 64, a drain terminal connected to the output terminal 69, and a source terminal connected to the input terminal for the power source voltage VSS. The capacitor C1a is connected to the interior node N1a at one end and connected to the output terminal 69 at the other end.

Now, functions of the components in the first unit circuit UCa will be described. The thin film transistor T1a changes the potential of the interior node N1a toward the high level when the set signal Sa is at the high level. The thin film transistor T2a changes the potential of the interior node N1a toward the VSS potential when the reset signal Ra is at the high level. The thin film transistor T3a provides the potential of the first clock signal CKA to the output terminal 69 when the potential of the interior node N1a is at the high level. The thin film transistor T4a changes the potential of the interior node N1a toward the VSS potential when the potential of the interior node N2a is at the high level. The thin film transistor T5a changes the potential of the interior node N2a toward the high level when the second clock signal CKB is at the high level. The thin film transistor T6a changes the potential of the interior node N2a toward the VSS potential when the potential of the interior node N1a is at the high level. The thin film transistor T7a changes the potential of the output signal Qa (the potential of the output terminal 69) toward the VSS potential when the second clock signal CKB is at the high level. The capacitor C1a functions as a boot strap capacity used to increase not only the potential of the output terminal 69 but also the potential of the interior node N1a.

The thin film transistor T4a, the thin film transistor T5a, and the thin film transistor T6a realize a circuit (hereinafter referred to as a "first output control node stabilizing unit") 312a configured to maintain the potential of the node N1a at the low level throughout non-select periods (the periods other than those when the gate bus line connected to the first unit circuit UCa is in the select state). However, the configuration of the first output control node stabilizing unit 312a illustrated in FIG. 7 is an example, and the present invention is not limited to this. The thin film transistor T7a realizes a circuit (hereinafter referred to as a first output node stabilizing unit") 314a configured to maintain the potential of the output signal Qa (the potential of the output terminal 69) at the low level throughout the non-select period. However, the configuration of the first output control node stabilizing unit 314a illustrated in FIG. 7 is an example, and the present invention is not limited to this.

According to the present embodiment, a first output control node turn-on transistor is realized by the thin film transistor T1a, a first output control node turn-off transistor is realized by the thin film transistor T2a, a first output control transistor is realized by the thin film transistor T1a, and a first capacity is realized by the capacitor C1a. A first output node is realized by the output terminal 69, and a first output control node is realized by the interior node N1a.

1.3.2 Second Unit Circuit

Figure 8:
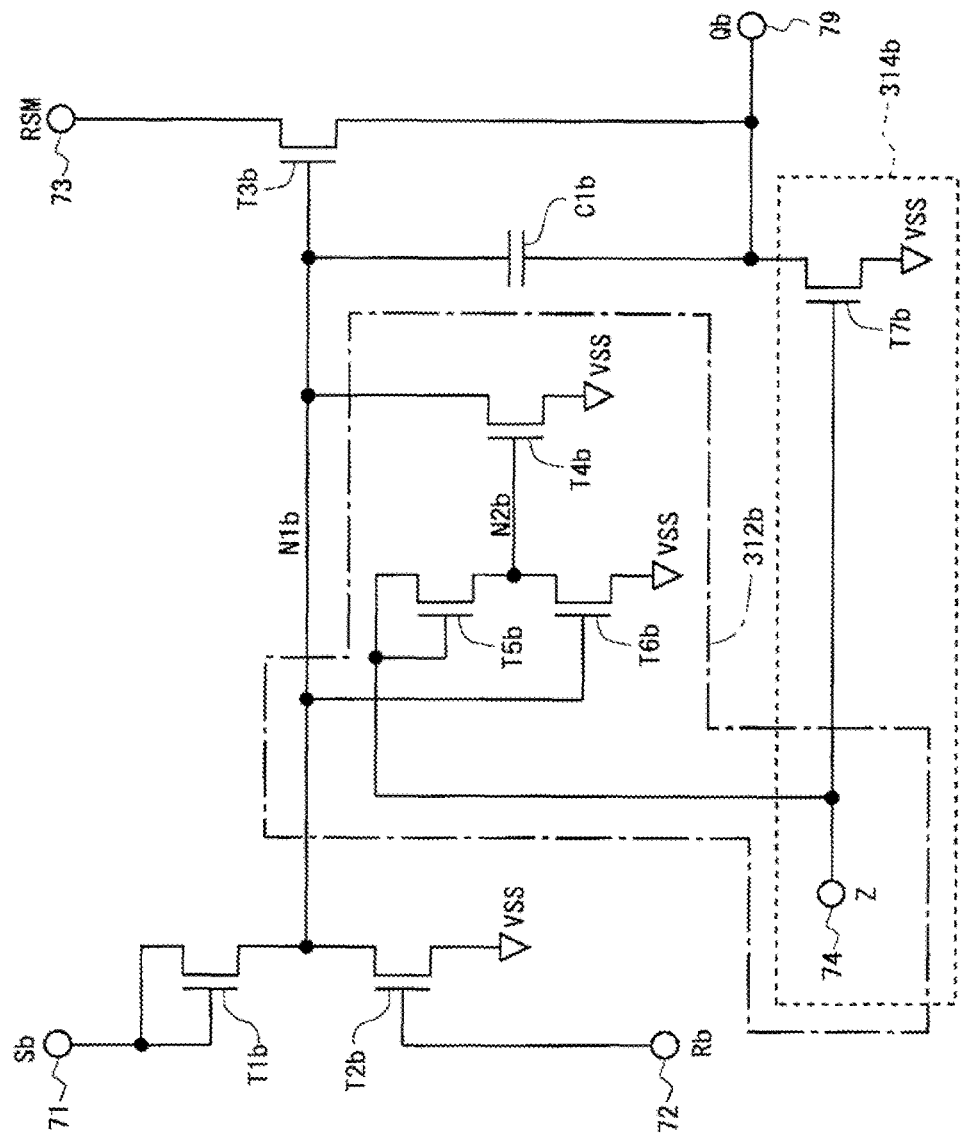
FIG. 8 is a circuit diagram illustrating a configuration of a second unit circuit according to the first embodiment.

FIG. 8 is a circuit diagram illustrating a configuration of the second unit circuit UCb according to the present embodiment. The second unit circuit UCb includes seven thin film transistors T1b to T7b and one capacitor C1b. The second unit circuit UCb includes four input terminals 71 to 74 and one output terminal 79, in addition to an input terminal for the low level power source voltage VSS. The input terminal receiving the set signal Sb is denoted by reference numeral 71, the input terminal receiving the reset signal Rb is denoted by reference numeral 72, the input terminal receiving the signal RSM is denoted by reference numeral 73, and the input terminal receiving the control signal Z is denoted by reference numeral 74. The output terminal outputting the output signal Qb is denoted by reference numeral 79. Connection related to the components in the second unit circuit UCb will be described below.

A source terminal of the thin film transistor T1b, a drain terminal of the thin film transistor T2b, a gate terminal of the thin film transistor T3b, a drain terminal of the thin film transistor T4b, and a gate terminal of the thin film transistor T6b are connected together. An interior node where these terminals are connected together is denoted by reference character N1b. A gate terminal of the thin film transistor T4b, a source terminal of the thin film transistor T5b, and a drain terminal of the thin film transistor T6b are connected together. An interior node where these terminals are connected together is denoted by reference character N2b.

The thin film transistor T1b includes a gate terminal and a drain terminal both connected to the input terminal 71 (in other words, the thin film transistor T1b is diode-connected) and the source terminal connected to the interior node N1b. The thin film transistor T2b includes a gate terminal connected to the input terminal 72, the drain terminal connected to the interior node N1b, and a source terminal connected to the input terminal for the power source voltage VSS. The thin film transistor T3b includes the gate terminal connected to the interior node N1b, a drain terminal connected to the input terminal 73, and a source terminal connected to the output terminal 79. The thin film transistor T4b includes the gate terminal connected to the node N2b, the drain terminal connected to the interior node N1b, and a source terminal connected to the input terminal for the power source voltage VSS. The thin film transistor T5b includes a gate terminal and a drain terminal both connected to the input terminal 74 (in other words, the thin film transistor T5b is diode-connected), and the source terminal connected to the node N2b. The thin film transistor T6b includes the gate terminal connected to the interior node N1b, the drain terminal connected to the node N2b, and a source terminal connected to the input terminal for the power source voltage VSS. The thin film transistor T7b includes a gate terminal connected to the input terminal 74, a drain terminal connected to the output terminal 79, and a source terminal connected to the input terminal for the power source voltage VSS. The capacitor C1b is connected to the interior node N1b at one end and connected to the output terminal 79 at the other end.

Now, functions of the components in the second unit circuit UCb will be described. The thin film transistor T1b changes the potential of the interior node N1b toward the high level when the set signal Sb is at the high level. The thin film transistor T2a changes the potential of the interior node N1b toward the VSS potential when the reset signal Ra is at the high level. The thin film transistor T3b provides the potential of the signal RSM to the output terminal 79 when the potential of the interior node N1b is at the high level. The thin film transistor T4b changes the potential of the interior node N1b toward the VSS potential when the potential of the interior node N2b is at the high level. The thin film transistor T5b changes the potential of the interior node N2b toward the high level when the control signal Z is at the high level. The thin film transistor T6b changes the potential of the interior node N2b toward the VSS potential when the potential of the interior node N1b is at the high level. The thin film transistor T7b changes the potential of the output signal Qb (the potential of the output terminal 79) toward the VSS potential when the control signal Z is at the high level. The capacitor C1b functions as a boot strap capacity used to increase not only the potential of the output terminal 79 but also the potential of the interior node N1b.

The thin film transistor T4b, the thin film transistor T5b, and the thin film transistor T6b realize a circuit (hereinafter referred to as a "second output control node stabilizing unit") 312b configured to maintain the potential of the node N1b at the low level throughout the periods other than touch processing periods described below (except each short period preceding the beginning of the corresponding touch processing period). However, the configuration of the second output control node stabilizing unit 312b illustrated in FIG. 8 is an example, and the present invention is not limited to this. The thin film transistor T7b realizes a circuit (hereinafter referred to as a second output node stabilizing unit") 314b configured to maintain the potential of the output signal Qa (the potential of the output terminal 79) at the low level throughout the periods other than a part of each touch processing period preceding the end thereof. However, the configuration of the second output control node stabilizing unit 314b illustrated in FIG. 8 is an example, and the present invention is not limited to this.

According to the present embodiment, a second output control node turn-on transistor is realized by the thin film transistor T1b, a second output control node turn-off transistor is realized by the thin film transistor T2b, a second output control transistor is realized by the thin film transistor T3b, and a second capacity is realized by the capacitor C1b. A second output node is realized by the output terminal 79, and a second output control node is realized by the interior node N1b.

1.4 Driving Method

Figure 9:
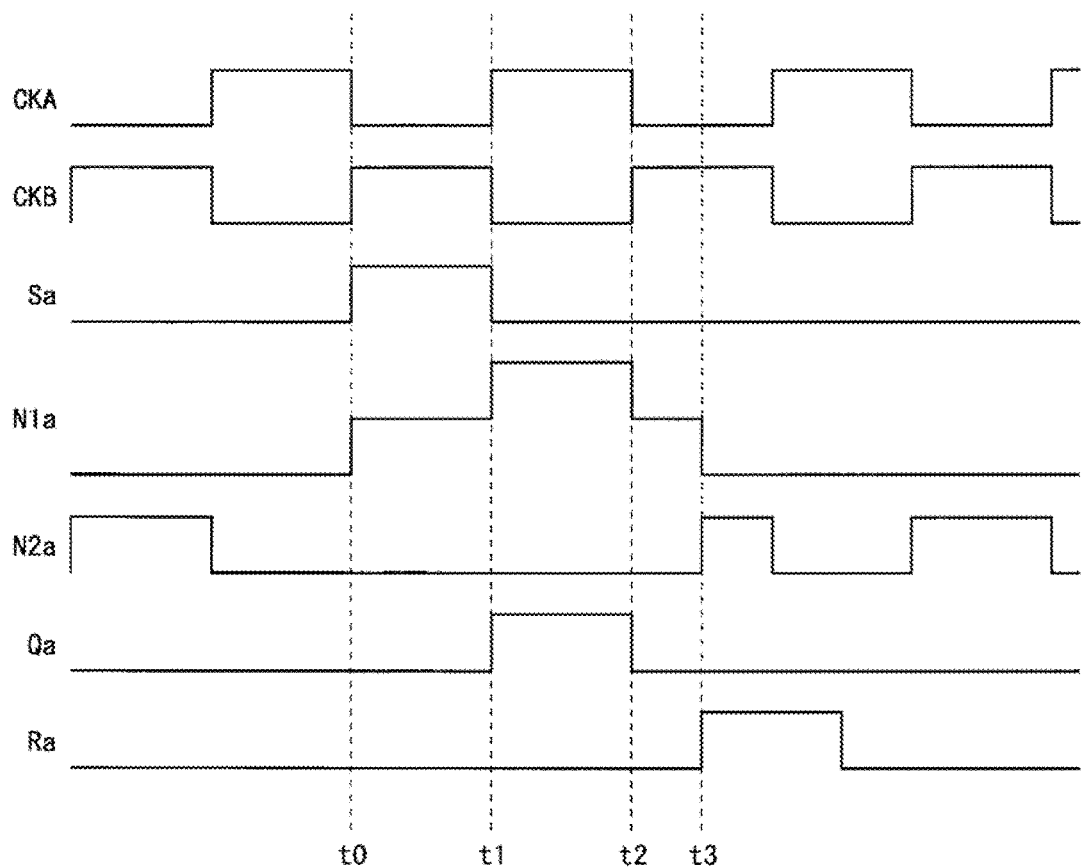
FIG. 9 is a timing chart describing basic actions of the first unit circuit according to the first embodiment.
Figure 10:
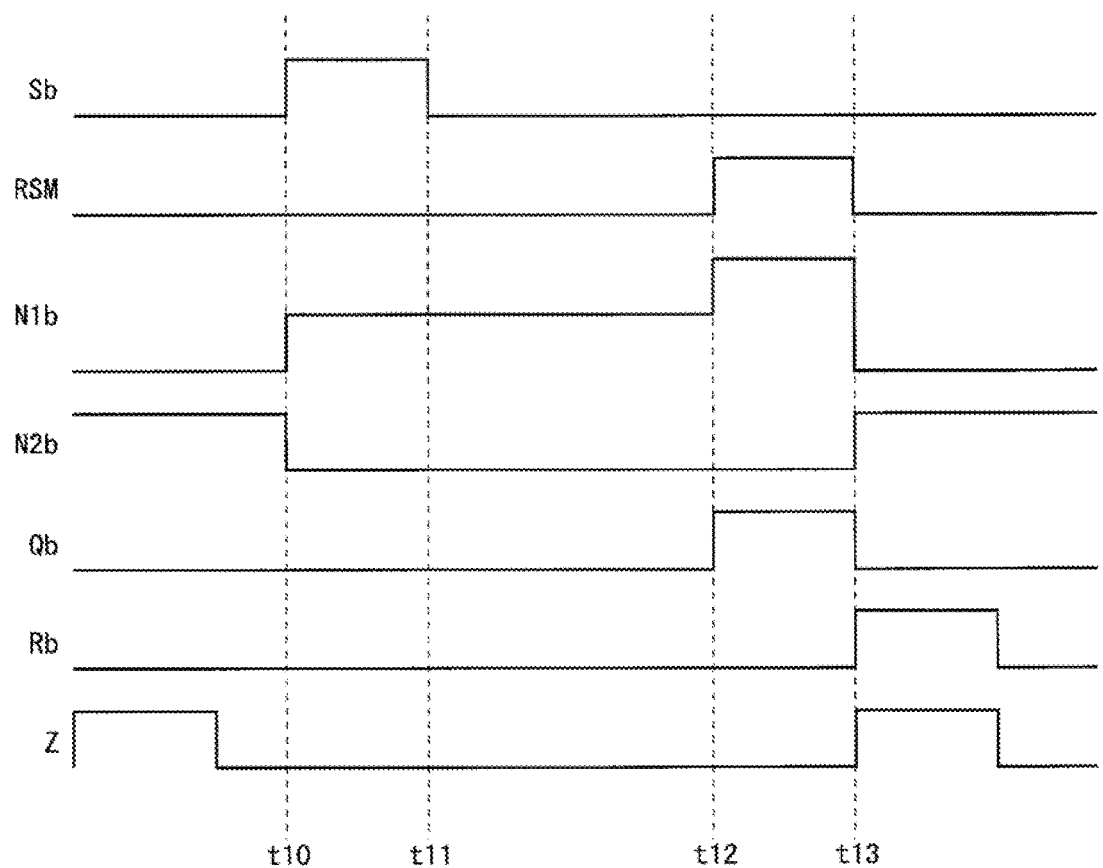
FIG. 10 is a timing chart describing basic actions of the second unit circuit according to the first embodiment.
Figure 11:
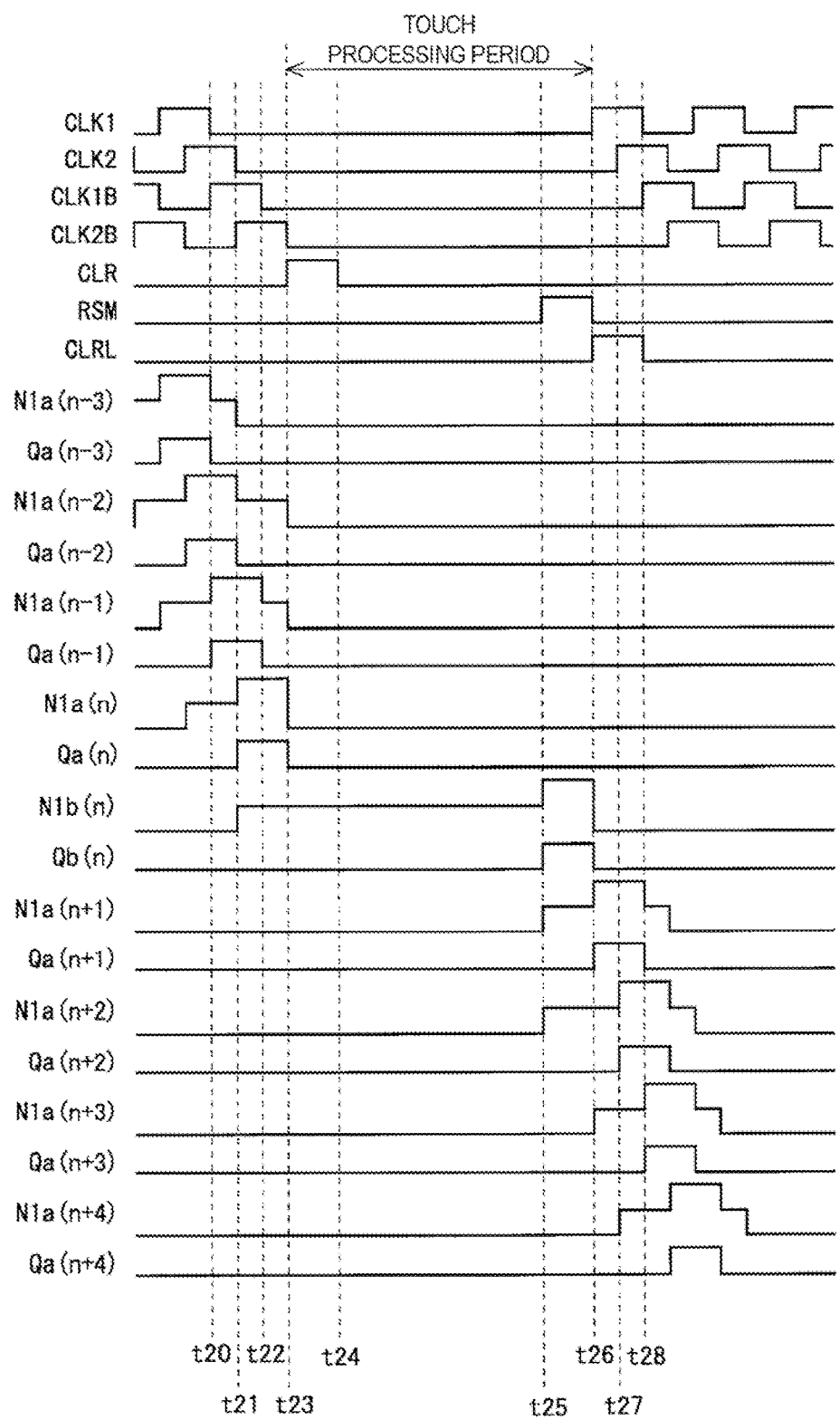
FIG. 11 is a timing chart describing actions performed when a scan is interrupted according to the first embodiment.
Figure 12:
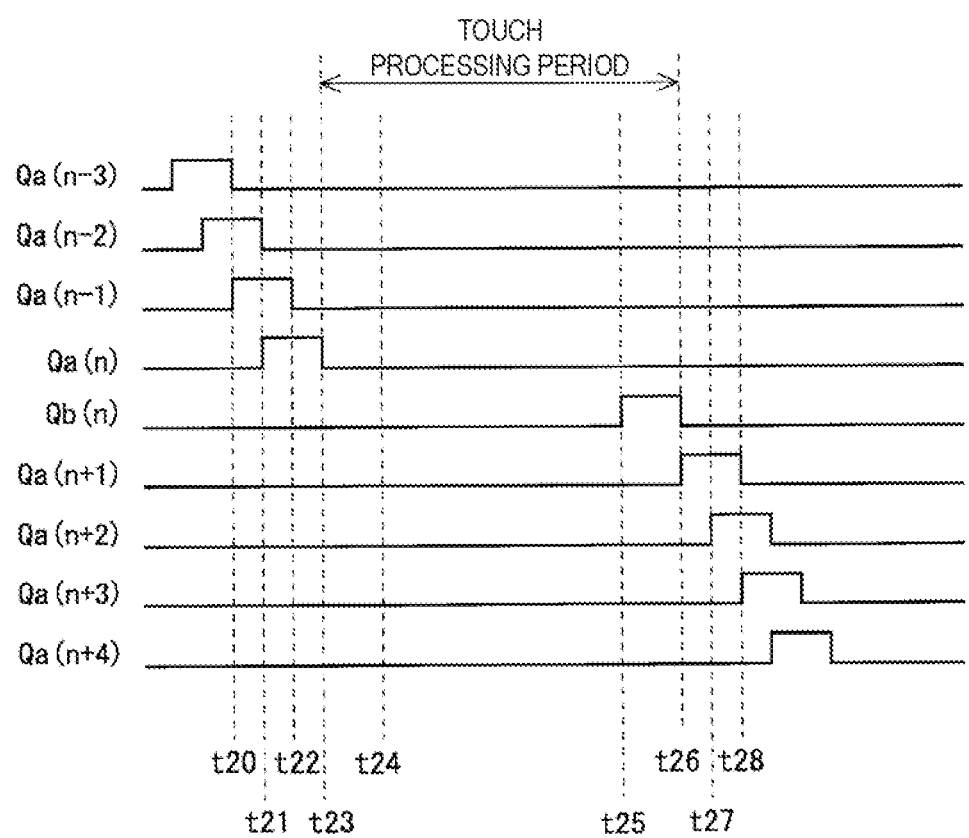
FIG. 12 is a timing chart illustrating waveforms of output signals obtained when the scan is interrupted according to the first embodiment.
Figure 13:
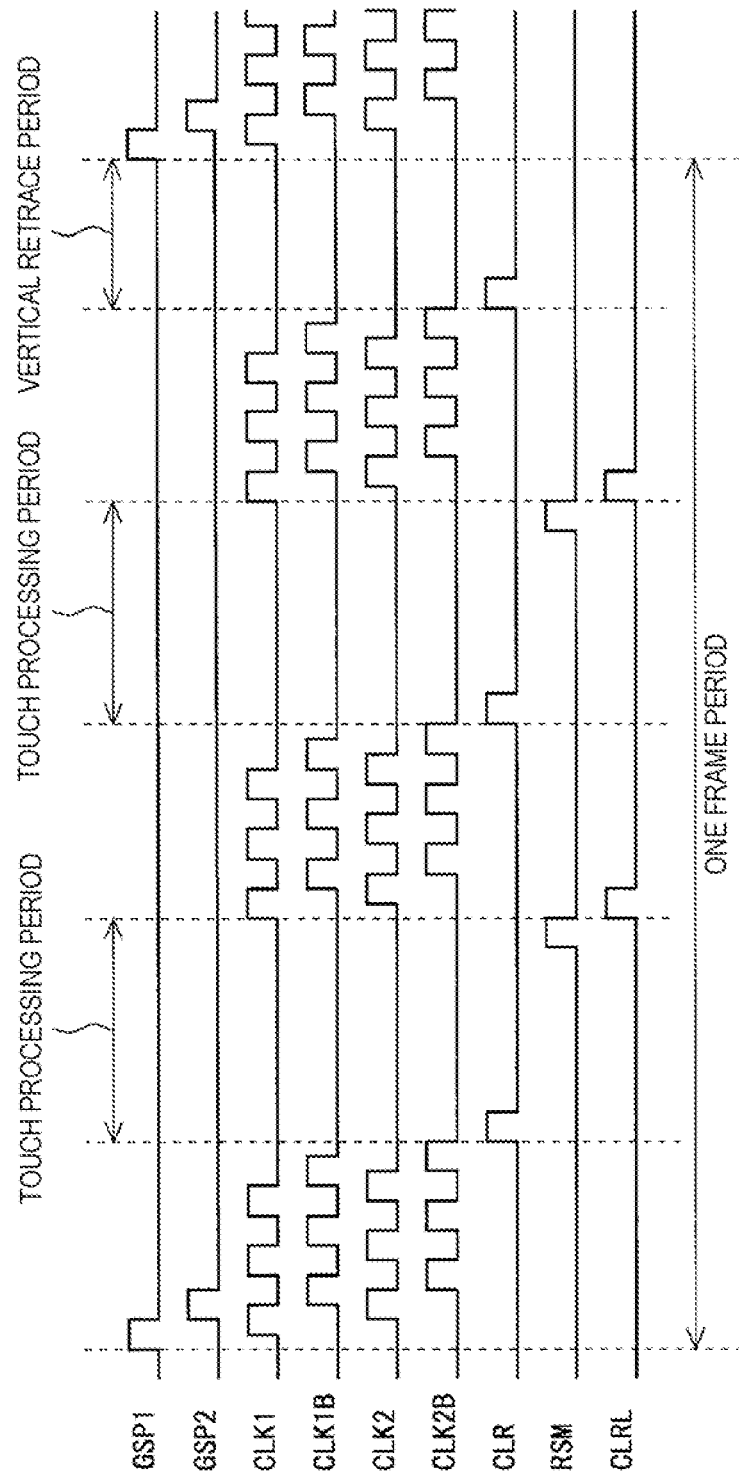
FIG. 13 is a timing chart describing how the shift register is driven in a case where two touch processing periods are to be provided during one frame period (one vertical scanning period) according to the first embodiment.

Now, a driving method according to the present embodiment will be described with reference to FIGS. 9 to 13. A period when a scan is stopped and processing on the touch panel (for example, processing for detecting a touched position) is executed is hereinafter referred to as the "touch processing period". FIG. 9 is a timing chart describing basic actions of the first unit circuit UCa. FIG. 10 is a timing chart describing basic actions of the second unit circuit UCb. FIG. 11 is a timing chart describing actions performed when the scan is interrupted. FIG. 12 is a timing chart illustrating waveforms of output signals Qa, Qb obtained when the scan is interrupted. FIG. 13 is a timing chart describing how the shift register is driven in a case where two touch processing periods are to be provided during one frame period (one vertical scanning period).

1.4.1 First Unit Circuit

First, with reference to FIG. 9, the basic actions of the first unit circuit UCa will be described. During the period before a point of time t0, the potential of the interior node N1*a* and the potential of the output signal Qa (the potential of the output terminal 69) are at the low level. At the point of time t0, a pulse (shift pulse) of the set signal Sa is provided to the input terminal 61. Since the thin film transistor T1*a* is diode-connected as illustrated in FIG. 7, the pulse of the set signal Sa sets the thin film transistor T1*a* to an on state to charge the capacitor C1*a*. Consequently, the potential of the interior node N1*a* changes from the low level to the high level to set the thin film transistor T3*a* to the on state. During a period from the point of time t0 to a point of time t1, the first clock signal CKA is maintained at the low level. Thus, during this period, the output signal Qa is maintained at the low level.

At the point of time t1, the first clock signal CKA changes from the low level to the high level. At this time, since the thin film transistor T3*a* is in the on state, the potential of the output terminal 69 increases as the potential of the input terminal 63 increases. Here, since the capacitor C1*a* is provided between the interior node N1*a* and the output terminal 69 as illustrated in FIG. 7, the potential of the interior node N1*a* increases as the potential of the output terminal 69 increases (the interior node N1*a* is set to a boost state). As a result, a high voltage is applied to the thin film transistor T3*a* to increase the potential of the output signal Qa up to the high level potential of the first clock signal CKA. Consequently, the gate bus line GL connected to the output terminal 69 of the first unit circuit UCa is set to the select state.

At the point of time t1, the set signal Sa changes from the high level to the low level. Consequently, the thin film transistor T1*a* is set to an off state. Setting the thin film transistor T to the off state in this manner does not affect the potential of the interior node N1*a*.

At a point of time t2, the first clock signal CKA changes from the high level to the low level. Consequently, the potential of the output terminal 69 decreases as the potential of the input terminal 63 increases, and the potential of the interior node N1*a* also decreases via the capacitor C1*a*. However, the potential of the interior node N1*a* decreases substantially by an amount equal to the decrease in the potential of the output terminal 69, and is maintained at the high level rather than being reduced to the low level. At the point of time t2, the second clock signal CKB changes from the low level to the high level. Consequently, the thin film transistor T7*a* is set to the on state. As a result, the potential of the output terminal 69, in other words, the potential of the output signal Qa, is set to the low level.

At a point of time t3, a pulse of the reset signal Ra is provided to the input terminal 62. Consequently, the thin film transistor T2*a* is set to the on state. As a result, the potential of the interior node N1*a* changes from the high level to the low level.

Since the potential of the interior node N1*a* is at the high level during a period from the point of time t0 to the point of time t3, the potential of the interior node N2*a* is maintained at the low level even when the thin film transistor T5*a* is set to the on state by the change of the second clock signal CKB to the high level. Therefore, the potential of the interior node N1*a* does not decrease to the low level during the period from the point of time t0 to the point of time t3. Since the second clock signal CKB is at the low level during a period from the point of time t1 to the point of time t2, the thin film transistor T7*a* is maintained in the off state. Thus, during this period, the potential of the output signal Qa does not decrease to the low level.

During the period preceding the point of time t0 and the period after the point of time t3, the potential of the interior node N2*a* is at the high level when the second clock signal CKB is at the high level. In other words, the thin film transistor T4*a* is set to the on state at intervals of a predetermined period. Consequently, even in a case where noise is generated at the interior node N1*a* as a result of a clock action of the first clock signal CKA, the potential of the interior node N1*a* is pulled to the VSS potential at intervals of the predetermined period. Similarly, during the period before the point of time t0 and the period after the point of time t3, even in a case where noise is generated at the output terminal 69, the potential of the output terminal 69 is pulled to the VSS potential at intervals of the predetermined period.

1.4.2 Actions of Second Unit Circuit

Now, with reference to FIG. 10, the basic actions of the second unit circuit UCb will be described. The scan of the gate bus line GL is assumed to be performed during the period before a point of time t10. During the period preceding the point of time t10, the potential of the interior node N1*b* and the potential of the output signal Qa (the potential of the output terminal 79) are at the low level, and the potential of the interior node N2*b* is at the high level.

At the point of time t10, a pulse (shift pulse) of the set signal Sb is provided to the input terminal 71. Since the thin film transistor T1*b* is diode-connected as illustrated in FIG. 8, the pulse of the set signal Sb sets the thin film transistor T1*b* to the on state to charge the capacitor C1*b*. Consequently, the potential of the interior node N1*a* changes from the low level to the high level to set the thin film transistor T3*b* to the on state. During a period from the point of time t10 to a point of time t11, the signal RSM is maintained at the low level. Thus, during this period, the output signal Qb is maintained at the low level.

At the point of time t11, the set signal Sb changes from the high level to the low level. Consequently, the thin film transistor T1*b* is set to the off state. At this time, since the potential of the interior node N1*b* is maintained by the capacitor C1*b*, the potential of the interior node N1*b* is not varied due to the change of setting the thin film transistor T1*b* to the off state. During a period from the point of time t11 to a point of time t12, the signal RSM is maintained at the low level. Thus, during this period, the output signal Qb is maintained at the low level.

At the point of time t12, the signal RSM changes from the low level to the high level. At this time, since the thin film transistor T3*b* is in the on state, the potential of the output terminal 79 increases as the potential of the input terminal 73 increases. Here, since the capacitor C1*b* is provided between the interior node N1*b* and the output terminal 79 as illustrated in FIG. 8, the potential of the interior node N1*b* increases as the potential of the output terminal 79 increases (the interior node N1*b* is set to the boost state). As a result, a high voltage is applied to the thin film transistor T3*b* to increase the potential of the output signal Qb up to the high level potential of the signal RSM.

At the point of time t13, the signal RSM changes from the high level to the low level. Consequently, the potential of the output terminal 79 decreases as the potential of the input terminal 73 increases, and the potential of the interior node N1*b* also decreases via the capacitor C1*b*. At the point of time t13, the reset signal Rb changes from the low level to the high level. Consequently, the thin film transistor T2*b* is set to the on state. As a result, the potential of the interior node N1*b* changes to the low level. At the point of time t13, the control signal Z changes from the low level to the high level. Consequently, the thin film transistor T7b is set to the on state. As a result, the potential of the output signal Qb is set to the low level.

1.4.3 Actions Performed when Scan is Interrupted

In light of above-described actions of the first unit circuit UCa and the second unit circuit UCb, actions performed when the scan is interrupted will be described with reference to FIG. 5 and FIG. 11. In FIG. 11, a period from a point of time t23 to a point of time t26 is assumed to be the touch processing period. As described above, the scan is assumed to be interrupted after the n-th gate bus line GLn is selected.

At a point of time just before the point of time t20, an output signal Qa(n−3) and an output signal Qa(n−2) are at the high level, and an interior node N1a(n−3), an interior node N1a(n−2), an interior node N1a(n−1), and an interior node N1a(n) are at the high level. At the point of time t20, the gate clock signal CLK1 changes from the high level to the low level, and the gate clock signal CLK1B changes from the low level to the high level. Consequently, the output signal Qa(n−3) is set to the low level, and an output signal Qa(n−1) is set to the high level.

At a point of time t21, the gate clock signal CLK2 changes from the high level to the low level, and the gate clock signal CLK2B changes from the low level to the high level. Consequently, the output signal Qa(n−2) is set to the low level, and the output signal Qa(n) is set to the high level. Since the output signal Qa(n) is provided to the first unit circuit UCa(n−3) as the reset signal Ra, the potential of the interior node N1a(n−3) is set to the low level. Furthermore, since the output signal Qa(n) is provided to the second unit circuit UCb(n) as the set signal Sb, the potential of an interior node N1b(n) is set to the high level.

At a point of time t22, the first clock signal CLK1B changes from the high level to the low level. Consequently, the output signal Qa(n−1) is set to the low level. At the point of time t22, the gate clock signal CLK1 is maintained at the low level.

At a point of time t23, the gate clock signal CLK2B changes from the high level to the low level. Consequently, the output signal Qa(n) is set to the low level. At the point of time t23, the signal CLR changes from the low level to the high level. The signal CLR is provided to the first unit circuit UCa(n−2), the first unit circuit UCa(n−1), and the first unit circuit UCa(n) as the reset signal Ra. Consequently, the potentials of the interior node N1a(n−2), the interior node N1a(n−1), and the interior node N1a(n) are set to the low level. In this manner, at the point of time t23, the scan of the gate bus line GL is stopped.

At a point of time t24, the signal CLR changes from the high level to the low level. The change in the level of the signal CLR at the point of time t24 does not affect the action of any first unit circuit UCa.

Subsequently, at a point of time t25 slightly before the point of time when the scan is to be resumed, the signal RSM changes from the low level to the high level. Consequently, in the second unit circuit UCb(n), the interior node N1b(n) is set to the boost state, and the output signal Qb(n) is set to the high level. Since the output signal Qb(n) is provided to the first unit circuit UCa(n+1) and the first unit circuit UCa(n+2) as the set signal Sa, the potentials of an interior node N1a(n+1) and an interior node N1a(n+2) are set to the high level.

At a point of time t26, the signal RSM changes from the high level to the low level, and the signal CLRL changes from the low level to the high level. Consequently, the output signal Qb(n) is set to the low level, and the potential of the interior node N1b(n) is set to the low level. At the point of time t26, the gate clock signal CLK1 changes from the low level to the high level. Consequently, the interior node N1a(n+1) is set to the boost state, and an output signal Qa(n+1) is set to the high level. The signal CLRL is set to the low level at a point of time t28.

At a point of time t27, the gate clock signal CLK2 changes from the low level to the high level. Consequently, the interior node N1a(n+2) is set to the boost state, and an output signal Qa(n+2) is set to the high level. In this manner, the scan of the gate bus line GL is resumed.

As described above, a touch processing period with a desired length can be ensured by performing scan interruption as illustrated in FIG. 12. For example, when two touch processing periods are to be provided during one frame period (one vertical scanning period), the signal CLR may be set to the high level at a point of time when the touch processing period is to be started and the clock action of the gate clock signal may be stopped throughout periods to be designated as the touch processing periods as illustrated in FIG. 13. As illustrated in FIG. 13, the signal RSM may be set to the high level slightly before a point of time when the touch processing period is to be ended, and the signal CLRL may be set to the high level, with the clock operation of the gate clock signal resumed, at the point of time when the touch processing period is to be ended.

According to the present embodiment, a shift action stopping step is realized by the action at the point of time t23, and a shift action resuming step is realized by the actions at the point of time t25 and the point of time t26.

1.5 Sizes of Thin Film Transistors and the Like

Here, the preferred sizes of the thin film transistors included in the first unit circuits UCa and the second unit circuits UCb will be described. As is understood from FIG. 7 and FIG. 8, the first unit circuits UCa and the second unit circuits UCb have different input signals but the same circuit configuration. Here, only the first unit circuits UCa of the first and second unit circuits UCa and UCb are connected to the respective gate bus lines GL (see FIG. 1). Therefore, the first unit circuits UCa need to drive a heavier load than the second unit circuits UCb.

Thus, for the sizes of the thin film transistors, the following relationships (1) to (3) are preferably satisfied. Note that the size as used herein means a "channel width/channel length". Hereinafter, the sizes of the thin film transistor T1a, the thin film transistor T2a, the thin film transistor T1a, the thin film transistor T1b, the thin film transistor T2b, and the thin film transistor T3b are denoted by S(T1a), S(T2a), S(T3a), S(T1b), S(T2b), and S(T3b), respectively.

$$S(T1a) > S(T1b) \quad (1)$$

$$S(T2a) > S(T2b) \quad (2)$$

$$S(T3a) > S(T3b) \quad (3)$$

The second unit circuits UCb configured to meet the above-described relationships allows suppression of an increase in the area of the shift register associated with addition of the circuit configured to enable scan interruption.

Relationship (4) below is preferably satisfied when capacitances of the capacitor C1a and the capacitor C1b are denoted by C(C1a) and C(C1b), respectively.

$$C(C1a) > C(C1b) \quad (4)$$

This allows more effective suppression of an increase in the area of the shift register associated with addition of the circuit configured to enable scan interruption.

The effect of suppressing the increase in the area of the shift register may be achieved even in a case where only one of Relationships (1) to (4) above is satisfied.

1.6 Effects

According to the present embodiment, the shift register 310 is provided with the second unit circuits UCb each including an unit circuit configured similarly to a unit circuit of the related art (the first unit circuit UCa), as unit circuits configured to enable scan interruption. The signal RSM and the signal CLRL are the only signals needed for the action of the second unit circuit UCb other than signals used in the related art. Thus, scan interruption may be achieved simply by providing the two new signals compared with related art. In the shift register disclosed in PTL 1, display failure occurs, the display failure being resulted from a difference in the magnitude of a threshold shift between each of the transistors in the unit circuit arranged at the position where the scan is stopped and each of the transistors in the other unit circuits. In this regard, according to the present embodiment, although a significant threshold shift occurs in the thin film transistor Tb3 during the stoppage of the scan because the interior node N1b in the second unit circuit UCb is maintained at the high level, the second unit circuit UCb is not connected to any gate bus line GL. Thus, the display quality is not affected by the significant threshold shift occurring in the thin film transistor Tb3. There are no significant differences among the plurality of first unit circuits UCa in the period of time when the gate of the thin film transistor Ta3 is biased. In other words, no significant differences occur among the plurality of first unit circuits UCa in the magnitude of a possible threshold shift in the thin film transistor Ta3. Therefore, possible display failure resulting from scan interruption is inhibited. As described above, according to the present embodiment, a shift register is realized that allows scan interruption to be achieved without causing a display failure.

According to the present embodiment, the first unit circuit UCa is provided with the first output control node stabilizing unit 312a configured to maintain the potential of the node N1a at the low level throughout the non-select period, and the second unit circuit UCb is provided with the second output control node stabilizing unit 312b configured to maintain the potential of the node N1b at the low level throughout the periods other than the touch processing periods (except each short period preceding the beginning of the corresponding touch processing period). Thus, even in a case where noise is mixed in the node N1a or the node N1b, an abnormal action caused by the noise is suppressed.

According to the present embodiment, the first unit circuit UCa is provided with the first output node stabilizing unit 314a configured to maintain the potential of the output signal Qa (the potential of the output terminal 69) at the low level throughout the non-select period, and the second unit circuit UCb is provided with the second output node stabilizing unit 314b configured to maintain the potential of the output signal Qb (the potential of the output terminal 79) at the low level throughout the periods other than a part of each touch processing period preceding the end thereof. Thus, even in a case where noise is mixed in the output terminal 69 or the output terminal 79, an abnormal action caused by the noise is suppressed.

2. Second Embodiment

A second embodiment of the present invention will be described below. The general configuration and the action outline are similar to those according to the first embodiment, and thus, the description thereof is omitted (see FIG. 2). Also in the present embodiment, the liquid crystal panel constituting a display unit 500 is assumed to be integrated with the touch panel.

2.1 Configuration of Gate Driver

A configuration of a gate driver 300 according to the present embodiment will be described below. According to the present embodiment, the gate driver 300 is constituted of a shift register 310 including a plurality of stages, and the shift register 310 includes the first unit circuits UCa including unit circuits connected to the respective gate bus lines GL and the second unit circuits UCb including unit circuits not connected to the gate bus lines GL, as is the case with the first embodiment (see FIG. 1).

Figure 14:
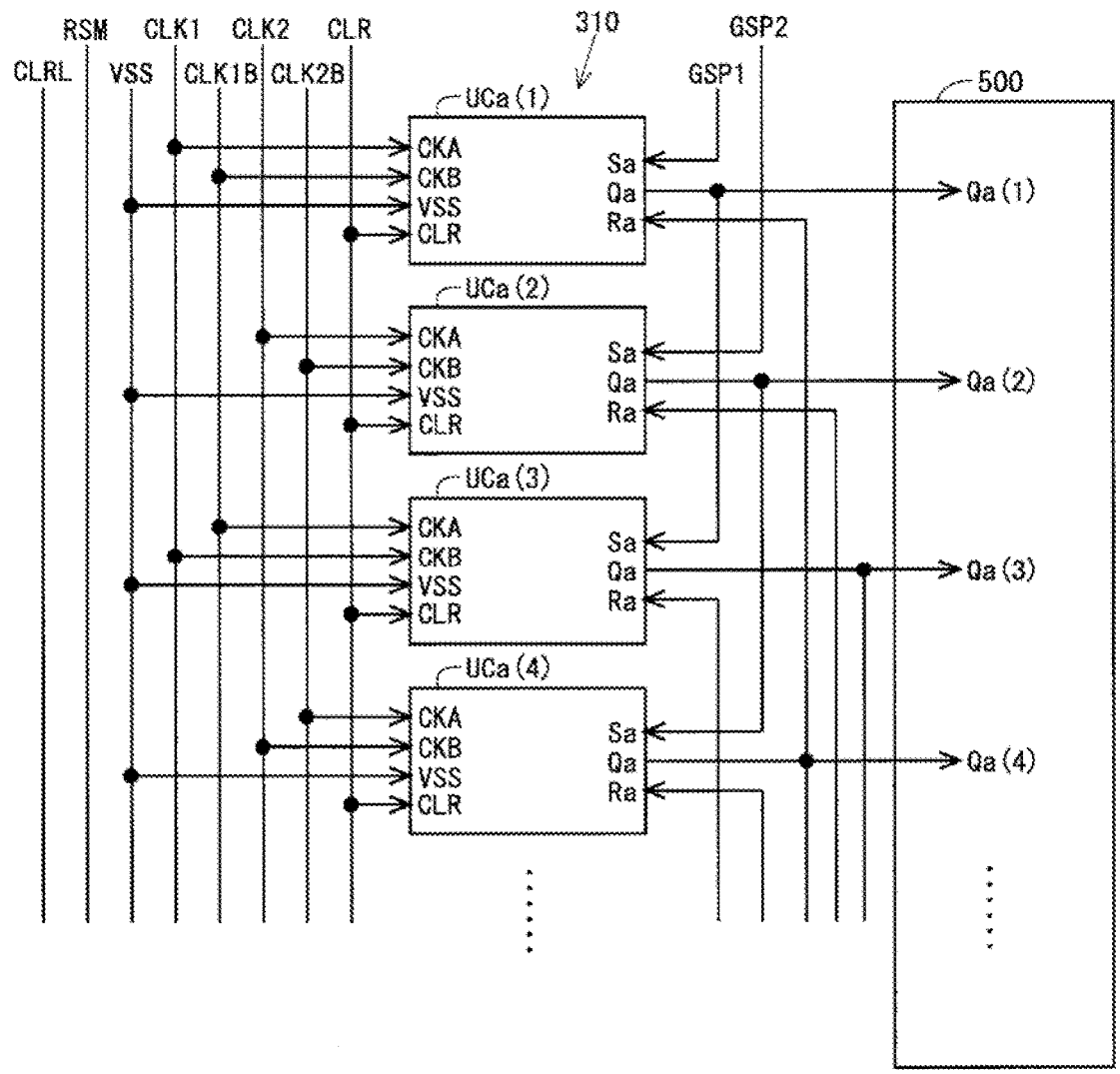
FIG. 14 is a block diagram illustrating a configuration of a shift register in a gate driver according to a second embodiment of the present invention.
Figure 15:
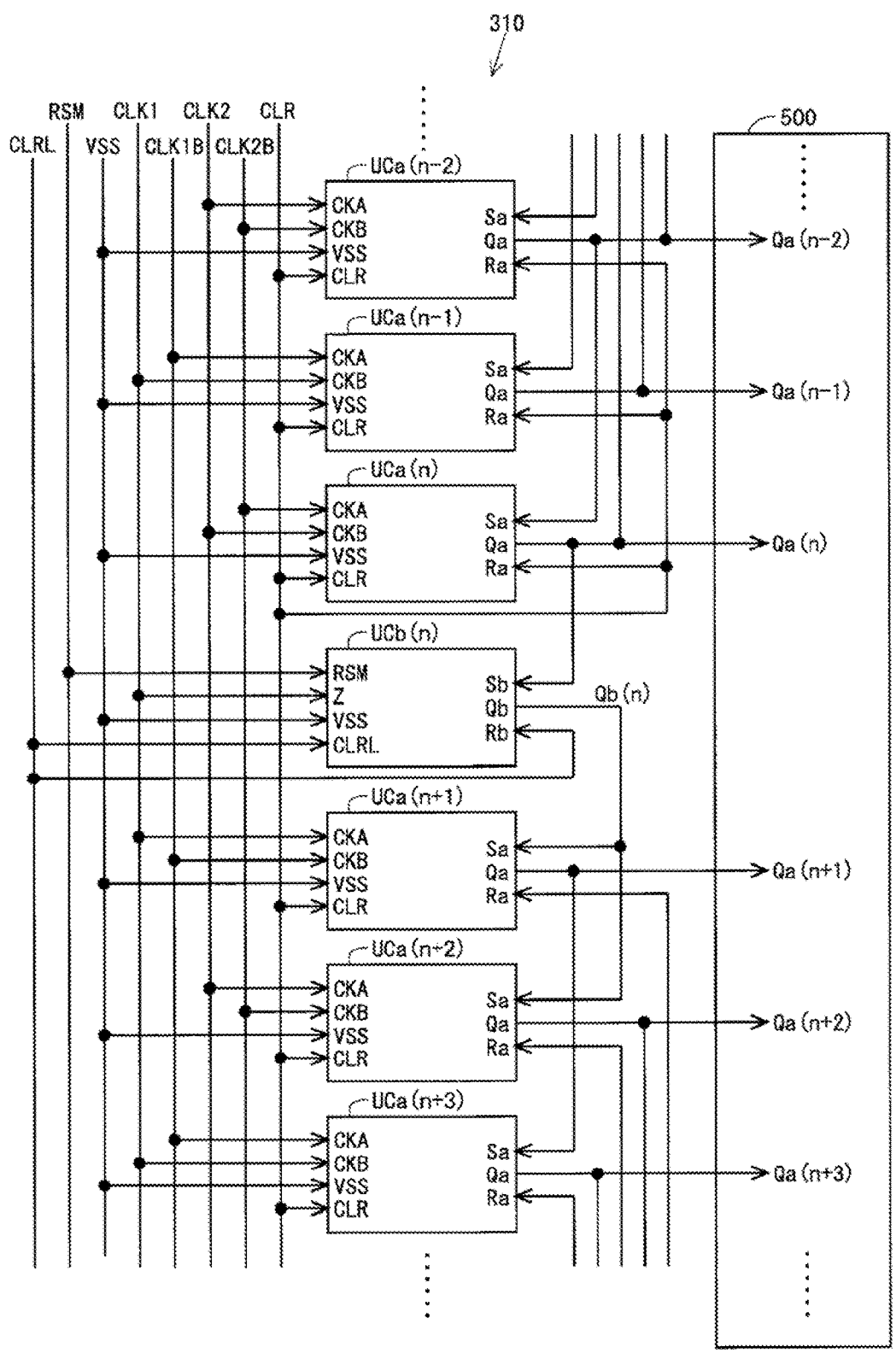
FIG. 15 is a block diagram illustrating the configuration of the shift register in the gate driver according to the second embodiment.

FIG. 14 and FIG. 15 are block diagrams illustrating a configuration of the shift register 310 in the gate driver 300 according to the present embodiment. FIG. 14 is a diagram describing a configuration of the first unit circuits UCa arranged at positions other than those near the second unit circuit UCb. FIG. 15 is a diagram describing a configuration of the second unit circuit UCb and the first unit circuits UCa arranged near the vicinity of the second unit circuit UCb.

As illustrated in FIG. 14 and FIG. 15, each of the first unit circuits UCa is provided with an input terminal configured to receive the signal CLR in addition to the input terminals provided according to the above-described first embodiment. As illustrated in FIG. 15, the second unit circuit UCb is provided with an input terminal configured to receive the signal CLRL in addition to the input terminals provided according to the above-described first embodiment.

2.2 Configuration of Unit Circuit

2.2.1 First Unit Circuit

Figure 16:
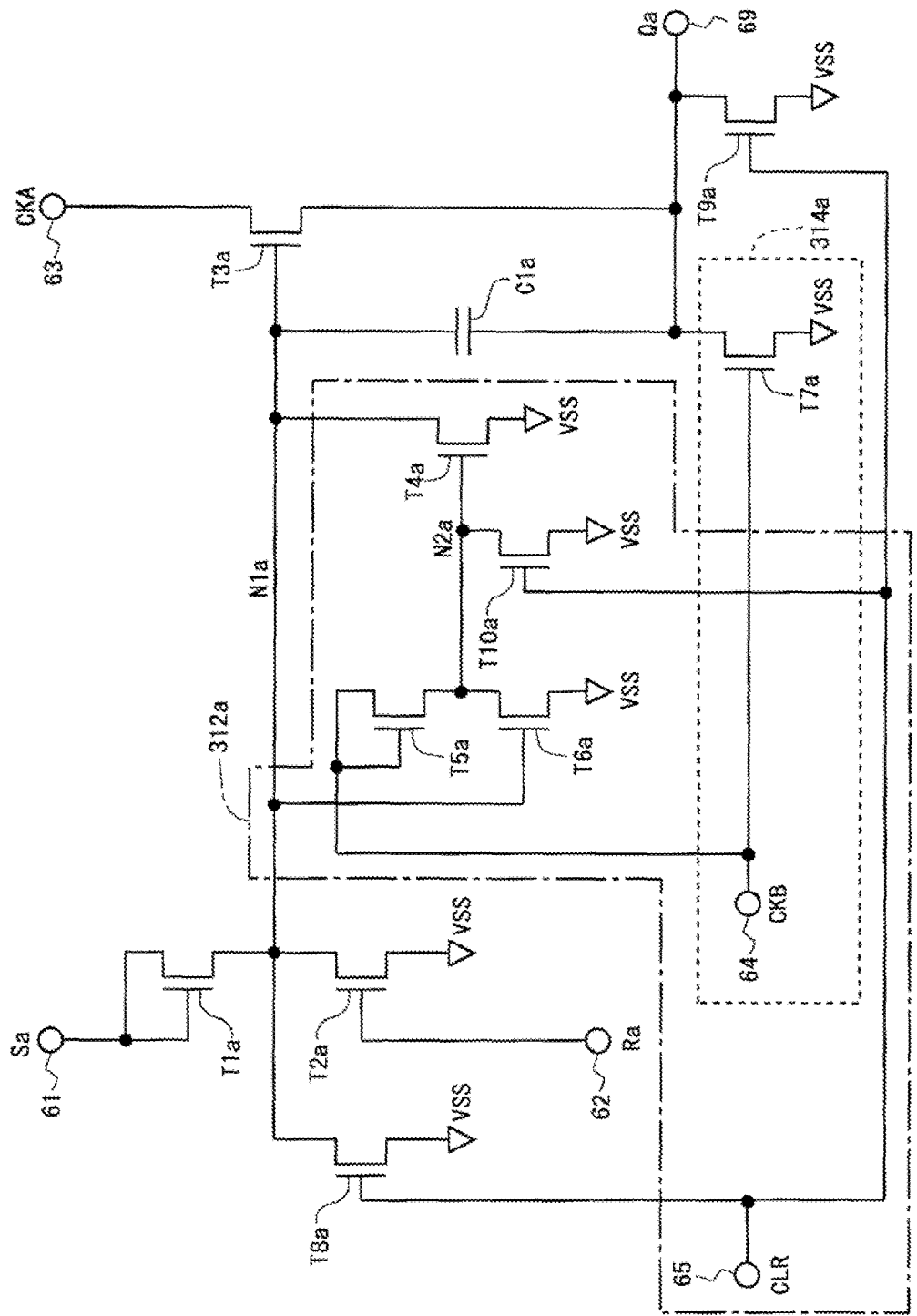
FIG. 16 is a circuit diagram illustrating a configuration of a first unit circuit according to the second embodiment.

FIG. 16 is a circuit diagram illustrating a configuration of the first unit circuit UCa according to the present embodiment. The first unit circuit UCa is provided with a thin film transistor T8a, a thin film transistor T9a, a thin film transistor T10a, and an input terminal 65 in addition to the components in the above-described first embodiment. The signal CLR is provided to the input terminal 65.

The thin film transistor T8a includes a gate terminal connected to the input terminal 65, a drain terminal connected to the interior node N1a, and a source terminal connected to the input terminal for the power source voltage VSS. The thin film transistor T9a includes a gate terminal connected to the input terminal 65, a drain terminal connected to the output terminal 69, and a source terminal connected to the input terminal for the power source voltage VSS. The thin film transistor T10a includes a gate terminal connected to the input terminal 65, a drain terminal connected to the interior node N2a, and a source terminal connected to the input terminal for the power source voltage VSS.

The thin film transistor T8a changes the potential of the interior node N1a toward the VSS potential when the signal CLR is at the high level. The thin film transistor T9a changes the potential of the output signal Qa (the potential of the output terminal 69) toward the VSS potential when the signal CLR is at the high level. The thin film transistor T10a changes the potential of the interior node N2a toward the VSS potential when the signal CLR is at the high level.

According to the present embodiment, a first output control node stabilizing unit 312a is realized by the thin film transistor T4a, the thin film transistor T5a, the thin film transistor T6a, and the thin film transistor T10a. A first output control node off maintaining transistor is realized by the thin film transistor T8a, and a first output node off maintaining transistor is realized by the thin film transistor T9a.

2.2.2 Second Unit Circuit

Figure 17:
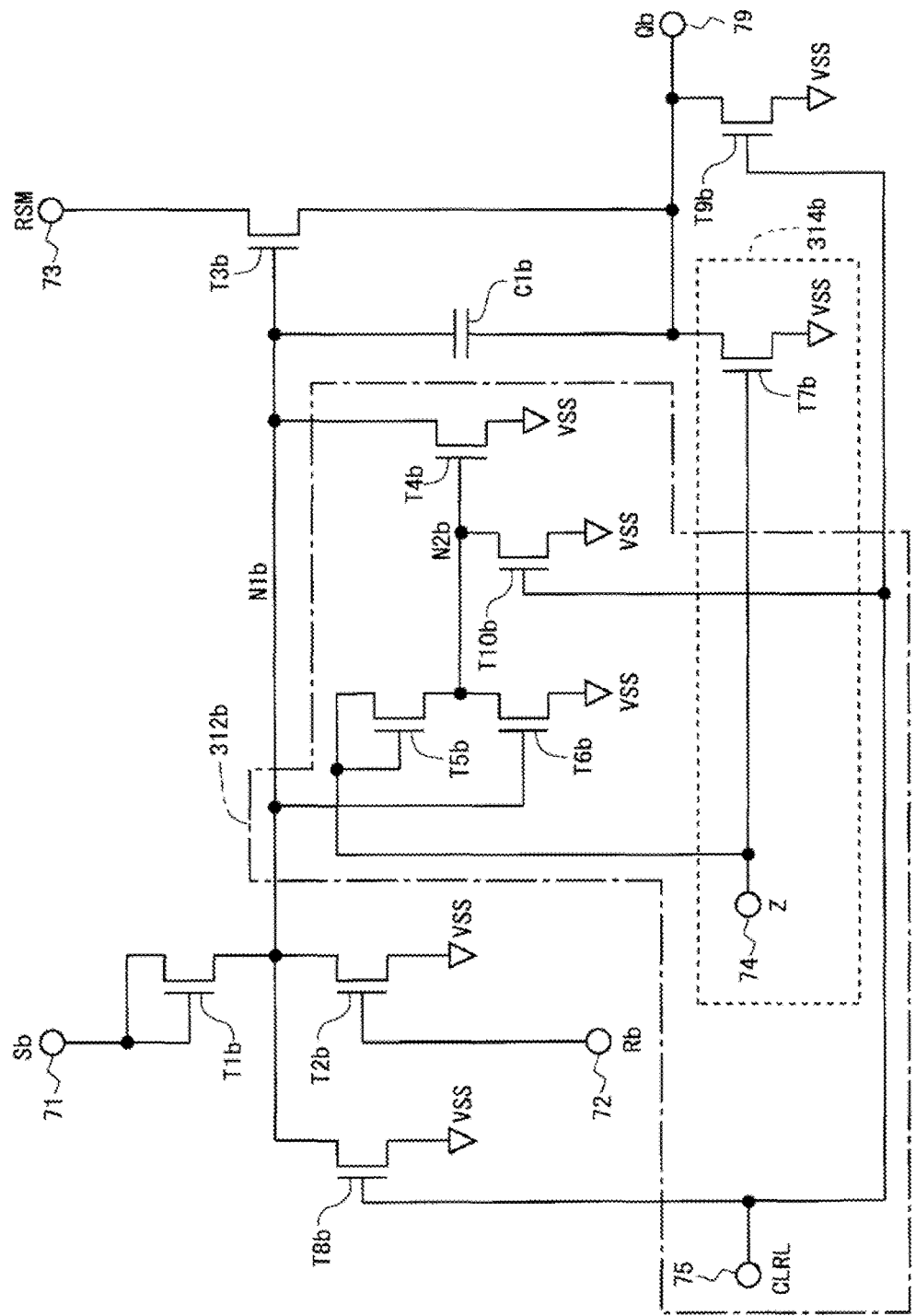
FIG. 17 is a circuit diagram illustrating a configuration of a second unit circuit according to the second embodiment.

FIG. 17 is a circuit diagram illustrating a configuration of the second unit circuit UCb according to the present embodiment. The second unit circuit UCb is provided with a thin film transistor T8b, a thin film transistor T9b, a thin film transistor T10b, and an input terminal 75 in addition to the components in the above-described first embodiment. The signal CLRL is provided to the input terminal 75.

The thin film transistor T8b includes a gate terminal connected to the input terminal 75, a drain terminal connected to the interior node N1b, and a source terminal connected to the input terminal for the power source voltage VSS. The thin film transistor T9b includes a gate terminal connected to the input terminal 75, a drain terminal connected to the output terminal 79, and a source terminal connected to the input terminal for the power source voltage VSS. The thin film transistor T10b includes a gate terminal connected to the input terminal 75, a drain terminal connected to the interior node N2b, and a source terminal connected to the input terminal for the power source voltage VSS.

The thin film transistor T8b changes the potential of the interior node N1b toward the VSS potential when the signal CLRL is at the high level. The thin film transistor T9b changes the potential of the output signal Qb (the potential of the output terminal 79) toward the VSS potential when the signal CLRL is at the high level. The thin film transistor T10b changes the potential of the interior node N2b toward the VSS potential when the signal CLRL is at the high level.

According to the present embodiment, a second output control node stabilizing unit 312b is realized by the thin film transistor T4b, the thin film transistor T5b, the thin film transistor T6b, and the thin film transistor T10b. A second output control node off maintaining transistor is realized by the thin film transistor T8b, and a second output node off maintaining transistor is realized by the thin film transistor T9b.

As is understood from FIG. 15 and FIG. 17, a signal provided to the input terminal 72 is the same as a signal provided to the input terminal 75. Therefore, the thin film transistor T8b and the input terminal 75 may be removed from the configuration illustrated in FIG. 17, and the gate terminal of the thin film transistor T9b and the gate terminal of the thin film transistor T10b may be connected to the input terminal 72.

2.3 Driving Method

Figure 18:
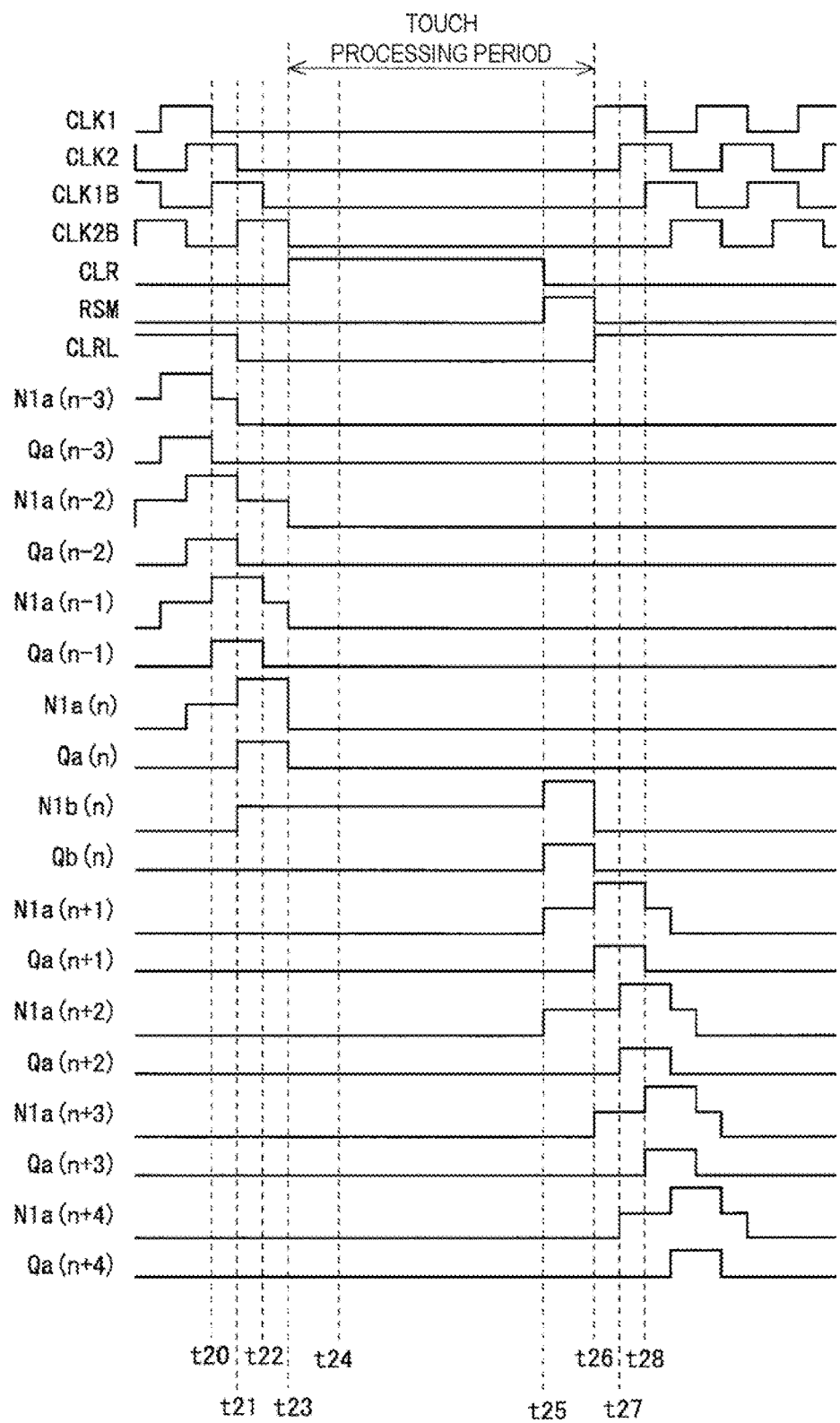
FIG. 18 is a timing chart illustrating actions performed when a scan is interrupted according to the second embodiment.
Figure 19:
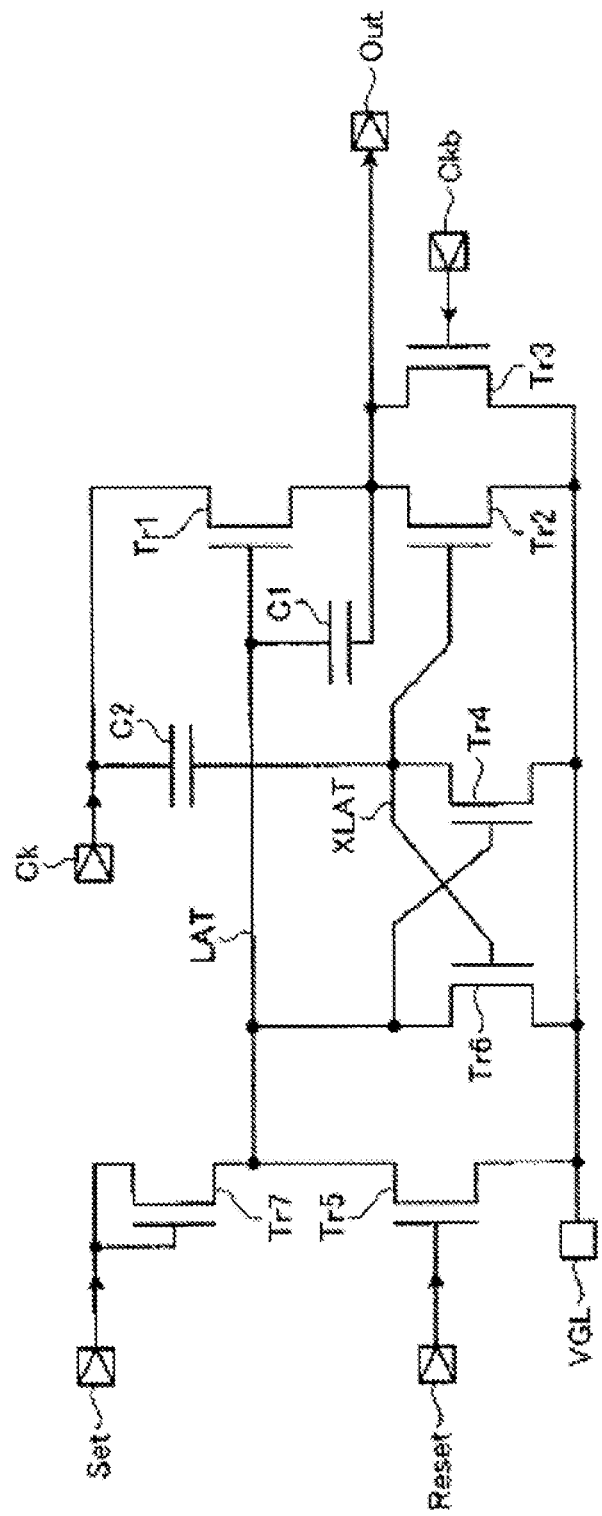
FIG. 19 is FIG. 9 of PTL 1.
Figure 20:
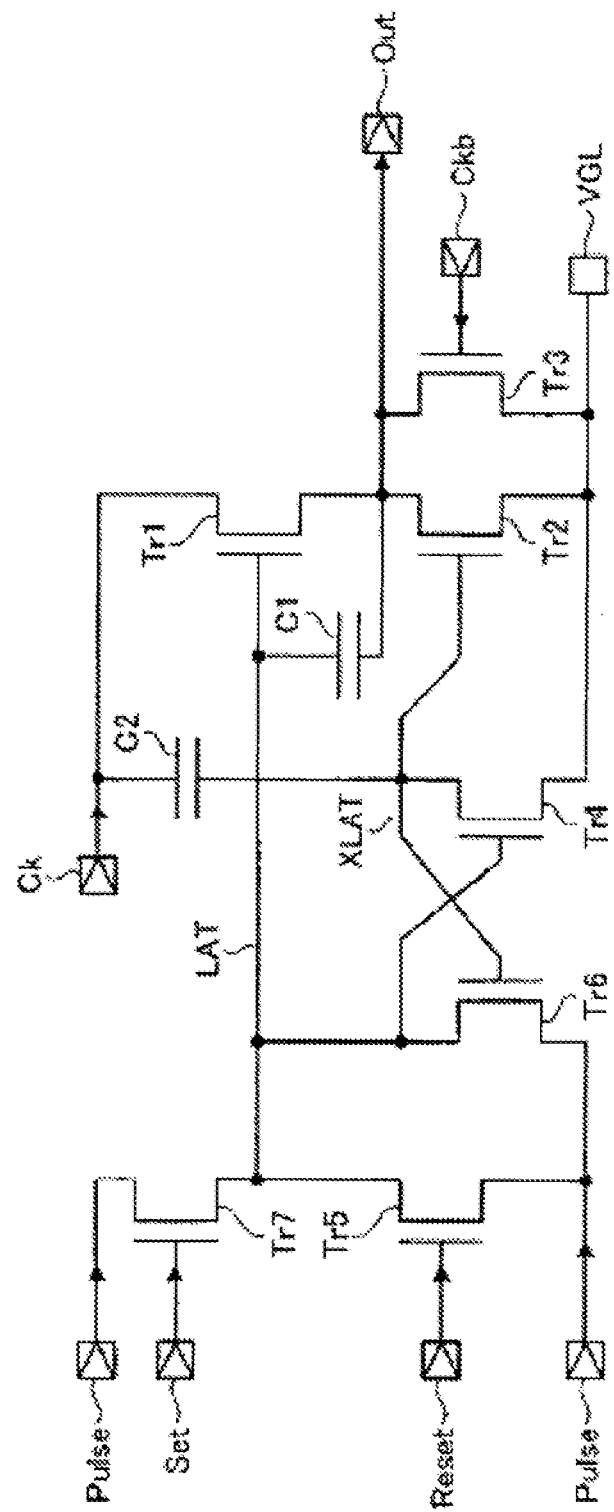
FIG. 20 is FIG. 10 of PTL 1.

Now, actions performed when the scan is interrupted will be described with reference to FIG. 18. At a point of time just before the point of time t20, the output signal Qa(n−3) and the output signal Qa(n−2) are at the high level, and the interior node N N1a(n−3), the interior node N1a(n−2), the interior node N1a(n−1), and the interior node N1a(n) are at the high level. Unlike in the above-described first embodiment, the signal CLRL is at the high level at the point of time just before the point of time t20. At the point of time t20, an action similar to that performed in the above-described first embodiment is performed.

At the point of time t21, an action similar to that performed in the above-described first embodiment is performed except that the signal CLRL changes from the high level to the low level. The change in the level of the signal CLRL at the point of time t21 does not affect the action of the second unit circuit UCb(n). At the point of time t22, an action similar to that performed in the above-described first embodiment is performed.

At the point of time t23, the gate clock signal CLK2B changes from the high level to the low level. Consequently, the potential of the output signal Qa(n) is set to the low level. At the point of time t23, the signal CLR changes from the low level to the high level. The signal CLR is provided to the first unit circuit UCa(n−2), the first unit circuit UCa(n−1), and the first unit circuit UCa(n) as the reset signal Ra. Consequently, the potentials of the interior node N1a(n−2), the interior node N1a(n−1), and the interior node N1a(n) are set to the low level. In this manner, at the point of time t23, the scan of the gate bus line GL is stopped.

According to the present embodiment, the signal CLR is provided to all the first unit circuits UCa in the shift register 310. Thus, at the point of time t23, the thin film transistor T8a, the thin film transistor T9a, and the thin film transistor T10a are set to the on state in all the first unit circuits UCa. Consequently, the potential of the interior node N1a, the potential of the output terminal 69, and the potential of the interior node N2a are pulled to the VSS potential in all the first unit circuits UCa.

At the point of time t24, unlike in the above-described first embodiment, the signal CLR is maintained at the high level. Subsequently, at the point of time t25 slightly before the point of time when the scan is to be resumed, the signal RSM changes from the low level to the high level. Consequently, as is the case with the above-described first embodiment, in the second unit circuit UCb(n), the interior node N1b(n) is set to the boost state, and the output signal Qb(n) is set to the high level. Since the output signal Qb(n) is provided to the first unit circuit UCa(n+1) and the first unit circuit UCa(n+2) as the set signal Sa, the potentials of the interior node N1a(n+1) and the interior node N1a(n+2) are set to the high level. According to the present embodiment, at the point of time t25, the signal CLR changes from the high level to the low level. In this manner, the present embodiment maintains the signal CLR at the high level for a longer period than the above-described first embodiment.

At the point of time t26, the signal RSM changes from the high level to the low level. Consequently, the potential of the output signal Qb(n) is set to the low level. At the point of time t26, the gate clock signal CLK1 changes from the low level to the high level. Consequently, the interior node N1a(n+1) is set to the boost state, and the output signal Qa(n+1) is set to the high level. At the point of time t26, the signal CLRL changes from the low level to the high level. Since the signal CLRL is provided to the second unit circuit UCb(n) as the reset signal Rb, the potential of the interior node N1b(n) is set to the low level. In the second unit circuit UCb, the signal CLRL is provided to the gate terminals of the thin film transistor T8b, the thin film transistor T9b, and the thin film transistor T10b. Consequently, in the second unit circuit UCb, the potential of the interior node N1b, the potential of the output terminal 79, and the potential of the interior node N2b are pulled to the VSS potential.

At the point of time t27, an action similar to that performed in the above-described first embodiment is performed. At the point of time t28, unlike in the above-described first embodiment, the signal CLRL is maintained at the high level. Consequently, the present embodiment maintains the signal CLRL at the high level for a longer period than the above-described first embodiment.

As described above, also in the present embodiment, the touch processing period with the desired length can be ensured by performing scan interruption (see FIG. 12).

2.4 Effects

According to the present embodiment, in addition to the effects achieved by the above-described first embodiment, the following effects are produced. While the scan is stopped, the thin film transistor T8a, the thin film transistor T9a, and the thin film transistor T10a are in the on state in all the first unit circuits UCa in the shift register 310. Thus, while the scan is stopped (while a shift action is stopped), the potentials of all the interior nodes and output nodes in the first unit circuit UCa can be maintained at the VSS potential. This suppresses an abnormal action attributed to noise caused by coupling of parasitic capacitance or the like (for example, an abnormal action attributed to turn-on of the thin film transistor 50 in the pixel forming unit 5 resulting from an increase in the potential of the output signal Qa). During the period when the scan is being performed, the thin film transistor T8b, the thin film transistor T9b, and the thin film transistor T10b are in the on state in all the second unit circuits UCb in the shift register 310. Thus, during the period when the scan is being performed, the potentials of all the interior nodes and output nodes in the second unit circuit UCb can be maintained at the VSS potential. This enables prevention of output of an incorrect shift pulse from the second unit circuit UCb to the first unit circuit UCa at the succeeding stage while the scan is being performed. As described above, according to the present embodiment, a shift register is realized that allows scan interruption to be achieved without causing a display failure or an abnormal action.

3. Other Matters

The embodiments have been described taking the liquid crystal display device as an example, but the present invention is not limited to this. The present invention is applicable to other display devices such as an organic Electro Luminescence (EL) display device.

The specific configuration of the unit circuits (the first unit circuits UCa and the second unit circuits UCb) constituting the shift register 310 is not limited to the configuration illustrated in the above-described embodiments. The example where the four-phase clock signal is used as the gate clock signal has been illustrated in the above-described embodiments, but the present invention is not limited to this. The present invention is applicable to a case where a clock signal with more or less than four phases is used as the gate clock signal.

The embodiments have been described with the example where the processing on the touch panel is executed while the scan is stopped, but the present invention is not limited to this. The present invention is also applicable to a case where the period when the scan is stopped is used for processing other than that on the touch panel.

REFERENCE SIGNS LIST 61 to 65 Input terminal (of first unit circuit)
69 Output terminal (of first unit circuit)
71 to 75 Input terminal (of second unit circuit)
79 Output terminal (of second unit circuit)
100 Display control circuit
200 Source driver (video signal line drive circuit)
300 Gate driver (scanning signal line drive circuit)
310 Shift register
400 Common electrode drive circuit
500 Display unit
C1a, C1b Capacitor (capacitive element)
CLK1, CLK1B, CLK2, CLK2B Gate clock signal
CKA First clock signal
CKB Second clock signal
GL1 to GLi Gate bus line
Sa, Sb Set signal
Ra, Rb Reset signal
Qa, Qb Output signal
T1a to T10a, T1b to T10b Thin film transistor
N1a, N1b, N2a, N2b Interior node
UCa First unit circuit
UCb Second unit circuit
VSS Low level power source voltage

The invention claimed is:

1. A shift register configured to drive a plurality of scanning signal lines by performing a shift action based on a plurality of clock signals, the shift register comprising a plurality of stages,
wherein a plurality of unit circuits each constitutes corresponding one of the plurality of stages, the unit circuits each including:
first unit circuits each connected to one of the plurality of scanning signal lines and configured to output a shift pulse to the connected scanning signal line and to a succeeding stage, wherein a first unit circuit comprises:
a first output node connected to a corresponding scanning signal line, a preceding stage, and a succeeding stage;
a first output control transistor including a control terminal, a first conducting terminal, and a second conducting terminal, one of the plurality of clock signals being provided to the first conducting terminal, and the second conducting terminal being connected to the first output node;
a first output control node connected to the control terminal of the first output control transistor;
a first output control node turn-on unit configured to change a level of the first output control node toward an on level based on a shift pulse output from the preceding stage; and
a first output control node turn-off unit configured to change the level of the first output control node toward an off level based on a shift pulse output from the succeeding stage; and
second unit circuits each connected to none of the plurality of scanning signal lines and configured to output a shift pulse to a succeeding stage, wherein a second unit circuit comprises:
a second output node connected to a succeeding stage;
a second output control transistor including a control terminal, a first conducting terminal, and a second conducting terminal, a signal changing from the off level to the on level at a timing slightly before resumption of the shift action after stoppage of the shift action being provided to the first conducting terminal, and the second conducting terminal being connected to the second output node;
a second output control node connected to the control terminal of the second output control transistor;

a second output control node turn-on unit configured to change a level of the second output control node toward the on level based on a shift pulse output from the preceding stage; and a second output control node turn-off unit configured to change the level of the second output control node toward the off level based on the signal changing from the off level to the on level at a timing for resumption of the shift action after stoppage of the shift action.

2. The shift register according to claim 1, wherein the first unit circuit further comprises a first output control node stabilizing unit configured to prevent a variation in the level of the first output control node during a period when the level of the first output control node is to be maintained at the off level, and the second unit circuit further comprises a second output control node stabilizing unit configured to prevent a variation in the level of the second output control node during a period when the level of the second output control node is to be maintained at the off level.

3. The shift register according to claim 1, wherein the first unit circuit further comprises a first output node stabilizing unit configured to prevent a variation in the level of the first output node during a period when the level of the first output node is to be maintained at the off level, and the second unit circuit further comprises a second output node stabilizing unit configured to prevent a variation in the level of the second output node during a period when the level of the second output node is to be maintained at the off level.

4. The shift register according to claim 1, wherein the first unit circuit further comprises:

a first output control node stabilizing unit configured to prevent a variation in the level of the first output control node during a period when the level of the first output control node is to be maintained at the off level; and a first output node stabilizing unit configured to prevent a variation in the level of the first output node during a period when the level of the first output node is to be maintained at the off level, and the second unit circuit further comprises:

a second output control node stabilizing unit configured to prevent a variation in the level of the second output control node during a period when the level of the second output control node is to be maintained at the off level; and a second output node stabilizing unit configured to prevent a variation in the level of the second output node during a period when the level of the second output node is to be maintained at the off level.

5. The shift register according to claim 1, wherein the first unit circuit further comprises:

a first output control node off maintaining transistor including a control terminal, a first conducting terminal, and a second conducting terminal, a signal maintained at the on level substantially throughout a period when the shift action is stopped being provided to the first conducting terminal, the first conducting terminal being connected to the first output control node, an off level potential being provided to the second conducting terminal; and a first output node off maintaining transistor including a control terminal, a first conducting terminal, and a second conducting terminal, a signal maintained at the on level substantially throughout the period when the shift action is stopped being provided to the first conducting terminal, the first conducting terminal being connected to the first output node, and the off level potential being provided to the second conducting terminal.

6. The shift register according to claim 1, wherein the second unit circuit further comprises:

a second output control node off maintaining transistor including a control terminal, a first conducting terminal, and a second conducting terminal, a signal maintained at the on level substantially throughout a period when the shift action is being performed being provided to the first conducting terminal, the first conducting terminal being connected to the second output control node, an off level potential being provided to the second conducting terminal; and a second output node off maintaining transistor including a control terminal, a first conducting terminal, and a second conducting terminal, a signal maintained at the on level substantially throughout the period when the shift action is being performed being provided to the first conducting terminal, the first conducting terminal being connected to the second output node, and the off level potential being provided to the second conducting terminal.

7. The shift register according to claim 1, wherein the first unit circuit further comprises:

a first output control node off maintaining transistor including a control terminal, a first conducting terminal, and a second conducting terminal, a signal maintained at the on level substantially throughout a period when the shift action is stopped being provided to the first conducting terminal, the first conducting terminal being connected to the first output control node, and an off level potential being provided to the second conducting terminal; and a first output node off maintaining transistor including a control terminal, a first conducting terminal, and a second conducting terminal, a signal maintained at the on level substantially throughout the period when the shift action is stopped being provided to the first conducting terminal, the first conducting terminal being connected to the first output node, and the off level potential being provided to the second conducting terminal, and the second unit circuit further includes:

a second output control node off maintaining transistor including a control terminal, a first conducting terminal, and a second conducting terminal, a signal maintained at the on level substantially throughout a period when the shift action is being performed being provided to the first conducting terminal, the first conducting terminal being connected to the second output control node, and an off level potential being provided to the second conducting terminal; and a second output node off maintaining transistor including a control terminal, a first conducting terminal, and a second conducting terminal, a signal maintained at the on level substantially throughout the period when the shift action is being performed being provided to the first conducting terminal, the first conducting terminal being connected to the second output node, and the off level potential being provided to the second conducting terminal.

8. The shift register according to claim 1, wherein the first output control node turn-on unit comprises a first output control node turn-on transistor including a control terminal, a first conducting terminal, and a second conducting terminal, a shift pulse output from the preceding stage being provided to the control terminal and the first conducting terminal, and the second conducting terminal being connected to the first output control node, the first output control node turn-off unit comprises a first output control node turn-off transistor including a control terminal, a first conducting terminal, and a second conducting terminal, a shift pulse output from the succeeding stage being provided to the control terminal, the first conducting terminal being connected to the first output control node, and the off level potential being provided to the second conducting terminal, the second output control node turn-on unit comprises a second output control node turn-on transistor including a control terminal, a first conducting terminal, and a second conducting terminal, a shift pulse output from the preceding stage being provided to the control terminal and the first conducting terminal, and the second conducting terminal being connected to the second output control node, and the second output control node turn-off unit comprises a second output control node turn-off transistor including a control terminal, a first conducting terminal, and a second conducting terminal, a signal changing from the off level to the on level at a timing when the shift action is resumed after stoppage of the shift action being provided to the control terminal, the first conducting terminal being connected to the second output control node, and the off level potential being provided to the second conducting terminal.

9. The shift register according to claim 8, wherein, when sizes of the first output control node turn-on transistor, the first output control node turn-off transistor, the first output control transistor, the second output control node turn-on transistor, the second output control node turn-off transistor, and the second output control transistor are denoted by $S(T1a)$, $S(T2a)$, $S(T3a)$, $S(T1b)$, $S(T2b)$, and $S(T3b)$, respectively, at least one of Relationships (1) to (3) is satisfied:

$$S(T1a) > S(T1b) \tag{1}$$

$$S(T2a) > S(T2b) \tag{2}$$

$$S(T3a) > S(T3b). \tag{3}$$

10. The shift register according to claim 8, wherein, when sizes of the first output control node turn-on transistor, the first output control node turn-off transistor, the first output control transistor, the second output control node turn-on transistor, the second output control node turn-off transistor, and the second output control transistor are denoted by $S(T1a)$, $S(T2a)$, $S(T3a)$, $S(T1b)$, $S(T2b)$, and $S(T3b)$, respectively, all of Relationships (1) to (3) are satisfied:

$$S(T1a) > S(T1b) \tag{1}$$

$$S(T2a) > S(T2b) \tag{2}$$

$$S(T3a) > S(T3b). \tag{3}$$

11. The shift register according to claim 10, wherein the first unit circuit further comprises a first capacity including a first end connected to the first output control node and a second end connected to the first output node, the second unit circuit further comprises a second capacity including a first end connected to the second output control node and a second end connected to the second output node, and when capacitances of the first capacity and the second capacity are denoted by $C(C1a)$ and $C(C1b)$, respectively, Relationship (4) is satisfied:

$$C(C1a) > (C1b) \tag{4}$$

12. A display device comprising:

a display unit with the plurality of scanning signal lines disposed; and the shift register according to claim 1.

13. The display device according to claim 12, comprising a touch panel integrated with the display unit, wherein processing on the touch panel is executed while the shift action is stopped.

14. The display device according to claim 13, wherein a signal output from the second output node included in the second unit circuit is provided to the touch panel.

15. The display device according to claim 12, wherein the transistors included in the plurality of unit circuits are each a thin film transistor including an oxide semiconductor layer.

16. The display device according to claim 15, wherein the thin film transistor is a channel etched thin film transistor.

17. The display device according to claim 15, wherein the oxide semiconductor layer contains indium gallium zinc oxide.

18. The display device according to claim 15, wherein the oxide semiconductor layer includes a crystal oxide semiconductor.

* * * * *